(12) United States Patent
Choi

(10) Patent No.: US 11,495,574 B2
(45) Date of Patent: Nov. 8, 2022

(54) SEMICONDUCTOR PACKAGE

(71) Applicant: Samsung Electronics Co., Ltd., Suwon-si (KR)

(72) Inventor: Yun Seok Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 18 days.

(21) Appl. No.: 16/840,772

(22) Filed: Apr. 6, 2020

(65) Prior Publication Data
US 2021/0050326 A1    Feb. 18, 2021

(30) Foreign Application Priority Data
Aug. 16, 2019    (KR) .................. 10-2019-0100400

(51) Int. Cl.
| H01L 23/02 | (2006.01) |
| H01L 25/065 | (2006.01) |
| H01L 23/498 | (2006.01) |
| H01L 25/10 | (2006.01) |
| H01L 23/00 | (2006.01) |
| H01L 23/538 | (2006.01) |

(52) U.S. Cl.
CPC .... *H01L 25/0655* (2013.01); *H01L 23/49816* (2013.01); *H01L 23/49822* (2013.01); *H01L 23/5389* (2013.01); *H01L 24/16* (2013.01); *H01L 24/32* (2013.01); *H01L 24/48* (2013.01); *H01L 24/73* (2013.01); *H01L 25/0657* (2013.01); *H01L 25/105* (2013.01); *H01L 2224/16235* (2013.01); *H01L 2224/32145* (2013.01); *H01L 2224/73253* (2013.01); *H01L 2225/06503* (2013.01); *H01L 2225/1058* (2013.01)

(58) Field of Classification Search
None
See application file for complete search history.

(56) References Cited

U.S. PATENT DOCUMENTS

| 9,040,348 | B2 * | 5/2015 | Vodrahalli | .......... H01L 25/0657 |
| | | | | 438/109 |
| 9,391,013 | B2 | 7/2016 | Mallik et al. | |
| 9,653,443 | B2 | 5/2017 | Cheng et al. | |
| 9,748,184 | B2 | 8/2017 | Shih et al. | |
| 9,761,559 | B1 | 9/2017 | Shih et al. | |
| 9,875,911 | B2 | 1/2018 | Pagaila et al. | |
| 9,917,066 | B2 | 3/2018 | Aoi et al. | |

(Continued)

FOREIGN PATENT DOCUMENTS

| JP | 2005-044989 A | | 2/2005 | |
| WO | WO-2019132960 A1 | * | 7/2019 | ......... H01L 23/5389 |

*Primary Examiner* — Hung K Vu
(74) *Attorney, Agent, or Firm* — Harness, Dickey & Pierce, P.L.C.

(57) ABSTRACT

Disclosed is a semiconductor package comprising a first semiconductor chip, a second semiconductor chip on a first surface of the first semiconductor chip, and a plurality of conductive pillars on the first surface of the first semiconductor chip and adjacent to at least one side of the second semiconductor chip. The first semiconductor chip includes a first circuit layer adjacent to the first surface of the first semiconductor chip. The second semiconductor chip and the plurality of conductive pillars are connected to the first surface of the first semiconductor chip.

18 Claims, 14 Drawing Sheets

(56) References Cited

U.S. PATENT DOCUMENTS

| | | | |
|---|---|---|---|
| 10,128,212 B2* | 11/2018 | Shih | H01L 24/97 |
| 2020/0006293 A1* | 1/2020 | Sankman | H01L 24/17 |
| 2020/0105653 A1* | 4/2020 | Elsherbini | H01L 23/642 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2019-0100400 filed on Aug. 16, 2019, in the Korean Intellectual Property Office, the disclosures of which is hereby incorporated by reference in its entirety.

BACKGROUND

The present inventive concepts relate to semiconductor packages, and more particularly, to stacked semiconductor packages.

A semiconductor package implements an integrated circuit chip for use in electronic products. Typically, in the semiconductor package, a semiconductor chip is mounted on a printed circuit board (PCB) and bonding wires or bumps are used to electrically connect the semiconductor chip to the printed circuit board. With the development of the electronic industry, demands for compactness, lightweight, and multi-functionality of electronic products lead to many studies on stacked semiconductor packages in which a plurality of semiconductor chips are stacked on a single semiconductor package.

SUMMARY

Some example embodiments of the present inventive concepts provide semiconductor packages which are capable of easily stacking a plurality of semiconductor chips and have excellent reliability.

According to some example embodiments of the present inventive concepts, a semiconductor package may comprise a first semiconductor chip; a second semiconductor chip on a first surface of the first semiconductor chip; and a plurality of conductive pillars on the first surface of the first semiconductor chip and adjacent to at least one side of the second semiconductor chip. The first semiconductor chip may include a first circuit layer adjacent to the first surface of the first semiconductor chip. The second semiconductor chip and the plurality of conductive pillars may be connected to the first surface of the first semiconductor chip.

According to some example embodiments of the present inventive concepts, a semiconductor package may comprise a first semiconductor chip; a plurality of second semiconductor chips on a first surface of the first semiconductor chip and horizontally spaced apart from each other; and a plurality of conductive pillars on the first surface of the first semiconductor chip and between the plurality of second semiconductor chips. The plurality of second semiconductor chips and the plurality of conductive pillars may be connected to the first surface of the first semiconductor chip.

According to some example embodiments of the present inventive concepts, a semiconductor package may comprise a lower structure; a first semiconductor chip on the lower structure; a second semiconductor chip between the lower structure and the first semiconductor chip; and a plurality of conductive pillars between the lower structure and the first semiconductor chip. The conductive pillars may be adjacent to at least one side of the second semiconductor chip. The second semiconductor chip and the conductive pillars may be connected to a first surface of the first semiconductor chip. The first surface of the first semiconductor chip faces the lower structure.

DETAILED DESCRIPTION OF EMBODIMENTS

The following will now describe in detail some example embodiments of the present inventive concepts with reference to the accompanying drawings.

Figure 1:
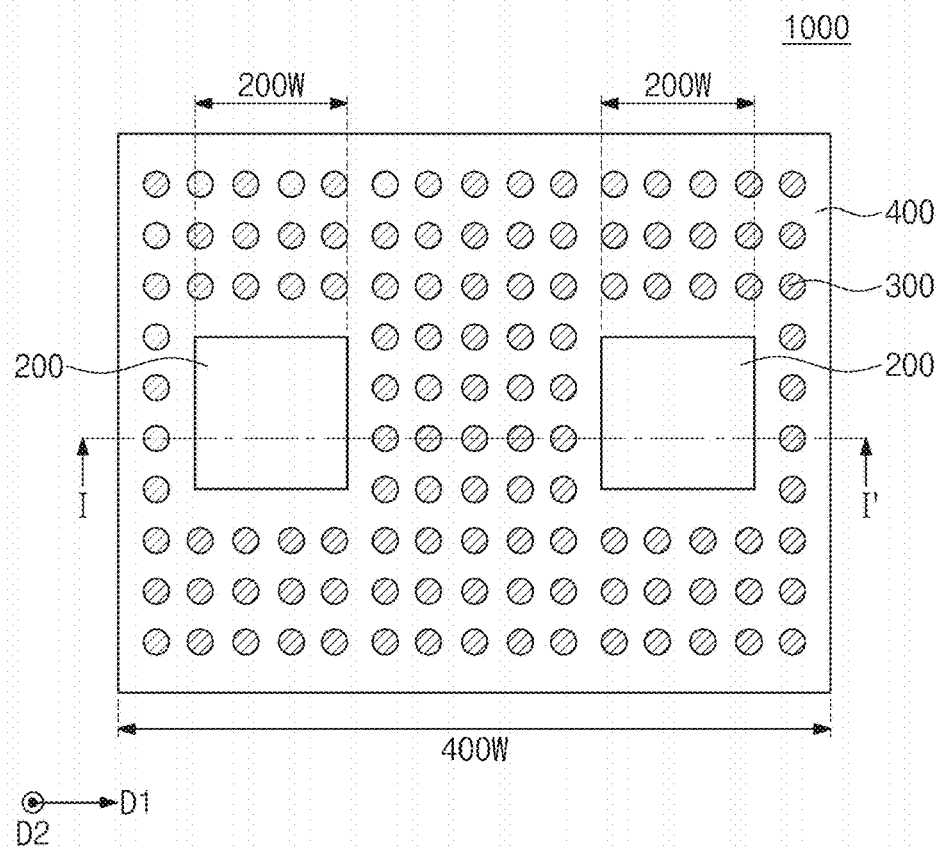
FIG. 1 illustrates a plan view showing a semiconductor package according to some example embodiments of the present inventive concepts.
Figure 2:
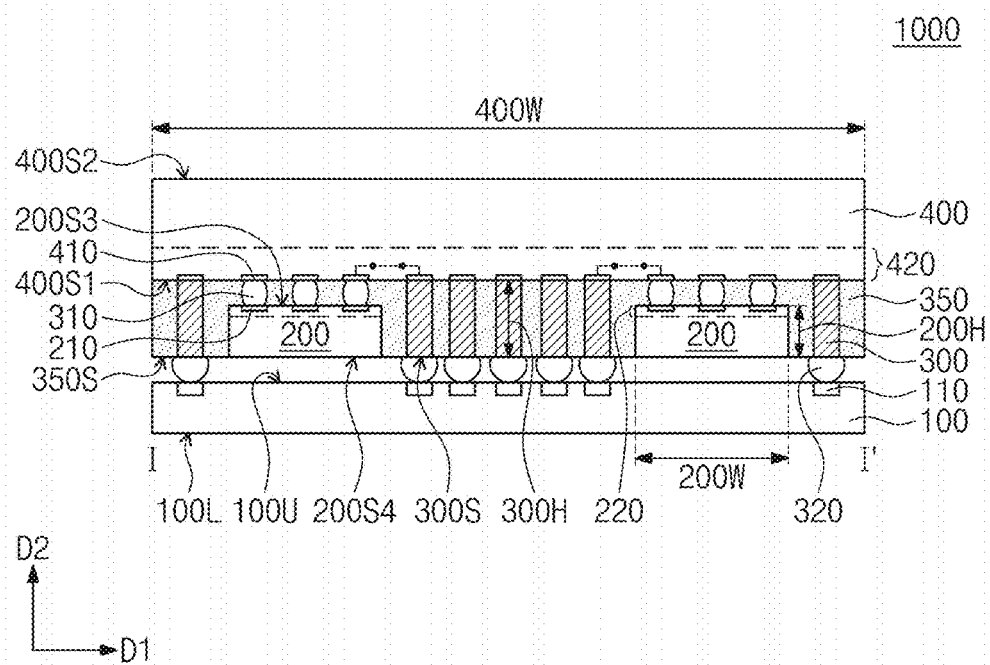
FIG. 2 illustrates a cross-sectional view taken along line I-I' of FIG. 1.

FIG. 1 illustrates a plan view showing a semiconductor package 1000 according to some example embodiments of the present inventive concepts. FIG. 2 illustrates a cross-sectional view taken along line I-I' of FIG. 1.

Referring to FIGS. 1 and 2, a first semiconductor chip 400 may be disposed on a substrate 100. The first semiconductor chip 400 may have a first surface 400S1 and a second surface 400S2 opposite to each other, and may include a first circuit layer 420 adjacent to the first surface 400S1. The first circuit layer 420 may include integrated circuits. The first semiconductor chip 400 may be disposed to allow the first surface 400S1 to face a top surface 100U of the substrate 100. The first semiconductor chip 400 may include first chip pads 410 disposed on the first surface 400S1. The first chip pads 410 may include a conductive material. The first semiconductor chip 400 may be a logic chip or a memory chip.

The substrate 100 may be, for example, a printed circuit board (PCB). The substrate 100 may include substrate pads 110, and the substrate pads 110 may be disposed on the top surface 100U of the substrate 100. The substrate pads 110 may include a conductive material. External terminals (not shown) may be disposed on a bottom surface 100L of the substrate 100, and the substrate pads 110 may be electrically connected to the external terminals through internal wiring lines in the substrate 100.

A second semiconductor chip 200 may be disposed between the substrate 100 and the first semiconductor chip 400. The second semiconductor chip 200 may be disposed on and connected to the first surface 400S1 of the first semiconductor chip 400. In some example embodiments, a plurality of second semiconductor chips 200 may be placed between the substrate 100 and the first semiconductor chip 400. The plurality of second semiconductor chips 200 may be disposed on the first surface 400S1 of the first semiconductor chip 400 and may be horizontally spaced apart from each other along a first direction D1. Each of the plurality of second semiconductor chips 200 may be connected to the first surface 400S1 of the first semiconductor chip 400.

The second semiconductor chip 200 may have a third surface 200S3 and a fourth surface 200S4 opposite to each other, and may include a second circuit layer 220 adjacent to the third surface 200S3. The second circuit layer 220 may include integrated circuits. The second semiconductor chip 200 may be disposed to allow the third surface 200S3 to face the first surface 400S1 of the first semiconductor chip 400. The second semiconductor chip 200 may include second chip pads 210 disposed on the third surface 200S3. The second chip pads 210 may include a conductive material.

Connectors 310 may be disposed between the first semiconductor chip 400 and the second semiconductor chip 200, and may be connected to corresponding second chip pads 210. The connectors 310 may be coupled to corresponding ones of the first chip pads 410 of the first semiconductor chip 400. The connectors 310 may include a conductive material and may have one or more of a solder ball shape, a bump shape, and a pillar shape. The second semiconductor chip 200 may be electrically connected to the first semiconductor chip 400 through the second chip pads 210, the connectors 310, and the corresponding first chip pads 410. The fourth surface 200S4 of the second semiconductor chip 200 may face and be spaced apart from the top surface 100U of the substrate 100.

The second semiconductor chip 200 may be a logic chip or a memory chip. For example, the first semiconductor chip 400 may be a logic chip, and the second semiconductor chip 200 may be a memory chip. In some example embodiments, at least one of the plurality of second semiconductor chips 200 may be replaced with a passive device (e.g., capacitor).

Each of the first and second semiconductor chips 400 and 200 may have a width along the first direction D1. The first semiconductor chip 400 may have a width 400W greater than a width 200W of the second semiconductor chip 200. In some example embodiments, the width 400W of the first semiconductor chip 400 may be greater than a sum of the widths 200w of the plurality of second semiconductor chips 200.

A plurality of conductive pillars 300 may be disposed between the substrate 100 and the first semiconductor chip 400. On the first surface 400S1 of the first semiconductor chip 400, the conductive pillars 300 may be placed adjacent to at least one side of the second semiconductor chip 200. In some example embodiments, the conductive pillars 300 may be disposed between the plurality of second semiconductor chips 200. The conductive pillars 300 may be horizontally spaced apart from each other along the first direction D1 on the first surface 400S1 of the first semiconductor chip 400. Each of the conductive pillars 300 may be connected to the first surface 400S1 of the first semiconductor chip 400. For example, the conductive pillars 300 may be connected to corresponding ones of the first chip pads 410 of the first semiconductor chip 400. The conductive pillars 300 may include metal (e.g., copper).

The second semiconductor chip 200 and each of the conductive pillars 300 may have their heights along a second direction D2 perpendicular to the first surface 400S1 of the first semiconductor chip 400. In some example embodiments, each of the conductive pillars 300 may have a height 300H greater than a height 200H of the second semiconductor chip 200. Each of the conductive pillars 300 may have a surface 300S that faces and is spaced apart from the top surface 100U of the substrate 100. The surface 300S of each of the conductive pillars 300 may be located at substantially the same level as that of the fourth surface 200S4 of the second semiconductor chip 200, from the first surface 400S1 of the first semiconductor chip 400.

A mold layer 350 may be disposed between the substrate 100 and the first semiconductor chip 400 and may cover lateral surfaces of the second semiconductor chip 200 and lateral surfaces of the conductive pillars 300, separating the second semiconductor chip 200 and the conductive pillars 300. The mold layer 350 may extend between the first semiconductor chip 400 and the second semiconductor chip 200, thereby covering the connectors 310. In some example embodiments, the mold layer 350 may be spaced apart from the top surface 100U of the substrate 100, and may have a surface 350S substantially coplanar with the fourth surface 200S4 of the second semiconductor chip 200 and with the surface 300S of each of the conductive pillars 300. The mold layer 350 may not cover but expose the fourth surface 200S4 of the second semiconductor chip 200 and the surface 300S of each of the conductive pillars 300. The mold layer 350 may include a dielectric material (e.g., epoxy-based molding compound).

A plurality of bumps 320 may be disposed between the substrate 100 and the conductive pillars 300 and may be connected to the conductive pillars 300. Each of the conductive pillars 300 may penetrate the mold layer 350 and may have connection with a corresponding one of the bumps 320. The bumps 320 may be connected to the substrate pads 110. Each of the conductive pillars 300 may be connected through the corresponding bump 320 to the substrate 100. The bumps 320 may include a conductive material.

The first semiconductor chip 400 may be electrically connected through the conductive pillars 300 to the substrate 100. In some example embodiments, the second semiconductor chip 200 may be spaced apart from the substrate 100. In this case, the second semiconductor chip 200 may be connected to a corresponding conductive pillar 300 through internal wiring lines in the first semiconductor chip 400, and may be electrically connected to the substrate 100 through the corresponding conductive pillar 300.

According to some example embodiments, the semiconductor package 1000 may include the first semiconductor chip 400 and the second semiconductor chip 200 that are stacked on the substrate 100. The semiconductor package 1000 may be provided in its upper portion with the first semiconductor chip 400 whose width is greater than that of the second semiconductor chip 200. Therefore, heat may be easily discharged outwardly from the first semiconductor chip 400. In addition, the semiconductor package 1000 may include the conductive pillars 300 for electrical connection between the first semiconductor chip 400 and the substrate 100. Because the first semiconductor chip 400 is electrically connected through the conductive pillars 300 to the substrate 100, the first semiconductor chip 400 may require no through electrode therein. As a result, there may be provided a semiconductor package that is capable of easily stacking a plurality of semiconductor chips and has excellent reliability.

Figure 3:
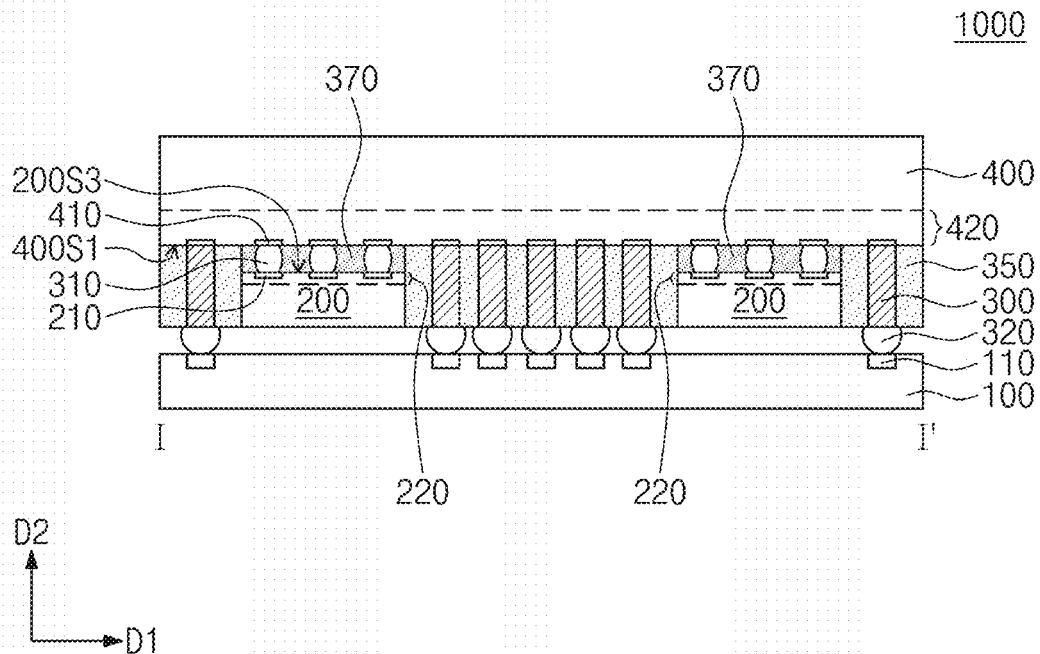
FIGS. 3 to 7 illustrate cross-sectional views taken along line I-I' of FIG. 1, showing a semiconductor package according to some example embodiments of the present inventive concepts.

FIG. 3 illustrates a cross-sectional views taken along line I-I' of FIG. 1, showing an example of the semiconductor package 1000 according to some example embodiments of the present inventive concepts. For brevity of description, the following will focus on differences from the semiconductor package 1000 discussed above with reference to FIGS. 1 and 2.

Referring to FIGS. 1 and 3, an under-fill layer 370 may be disposed between the first semiconductor chip 400 and the second semiconductor chip 200, and may cover the connectors 310. The under-fill layer 370 may cover the third surface 200S3 of the second semiconductor chip 200 and may fill gaps between the connectors 310. The under-fill layer 370 may be provided locally on the third surface 200S3 of the second semiconductor chip 200 and may be in contact with the mold layer 350. The under-fill layer 370 may include a dielectric polymeric material, such as epoxy resin.

Figure 4:
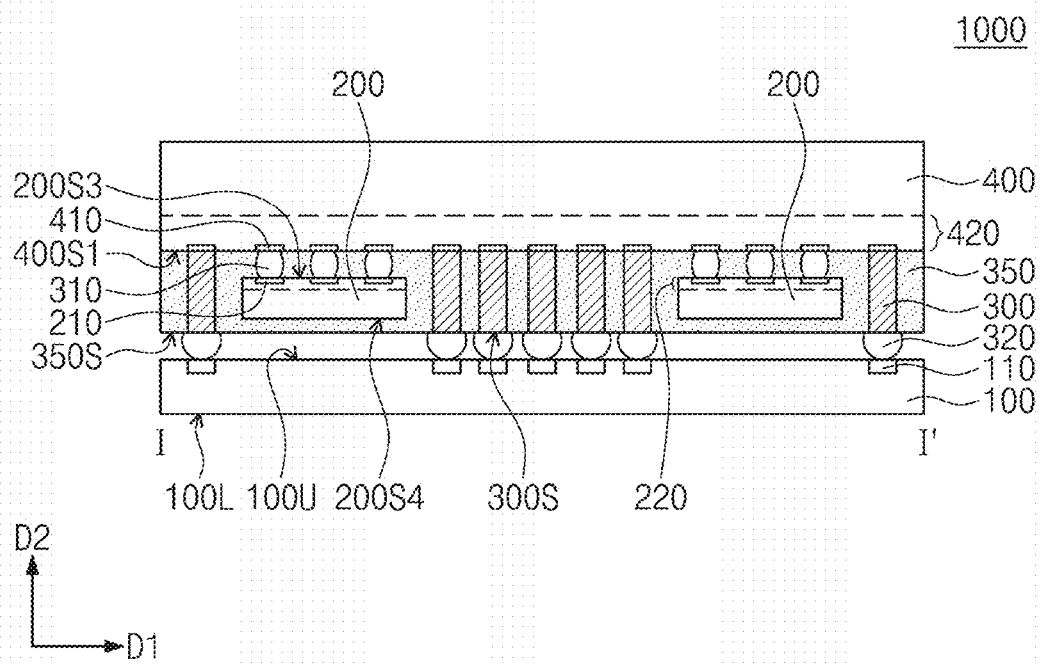

FIG. 4 illustrates a cross-sectional views taken along line I-I' of FIG. 1, showing an example of the semiconductor package 1000 according to some example embodiments of the present inventive concepts. For brevity of description, the following will focus on differences from the semiconductor package 1000 discussed above with reference to FIGS. 1 and 2.

Referring to FIGS. 1 and 4, the second semiconductor chip 200 may be disposed to allow the third surface 200S3 to face the first surface 400S1 of the first semiconductor chip 400, and may be connected to the first surface 400S1 of the first semiconductor chip 400. The fourth surface 200S4 of the second semiconductor chip 200 may face and be spaced apart from the top surface 100U of the substrate 100. The surface 300S of each of the conductive pillars 300 may face and be spaced apart from the top surface 100U of the substrate 100. In some example embodiments, the surface 300S of each of the conductive pillars 300 may be positioned farther away from the first surface 400S1 of the first semiconductor chip 400 than from the fourth surface 200S4 of the second semiconductor chip 200.

In some example embodiments, the mold layer 350 may cover lateral surfaces of the second semiconductor chip 200 and lateral surfaces of the conductive pillars 300, and may also cover the fourth surface 200S4 of the second semiconductor chip 200. The mold layer 350 may encapsulate the second semiconductor chip 200. The mold layer 350 may be spaced apart from the top surface 100U of the substrate 100, and the surface 350S of the mold layer 350 may be substantially coplanar with the surface 300S of each of the conductive pillars 300.

Figure 5:
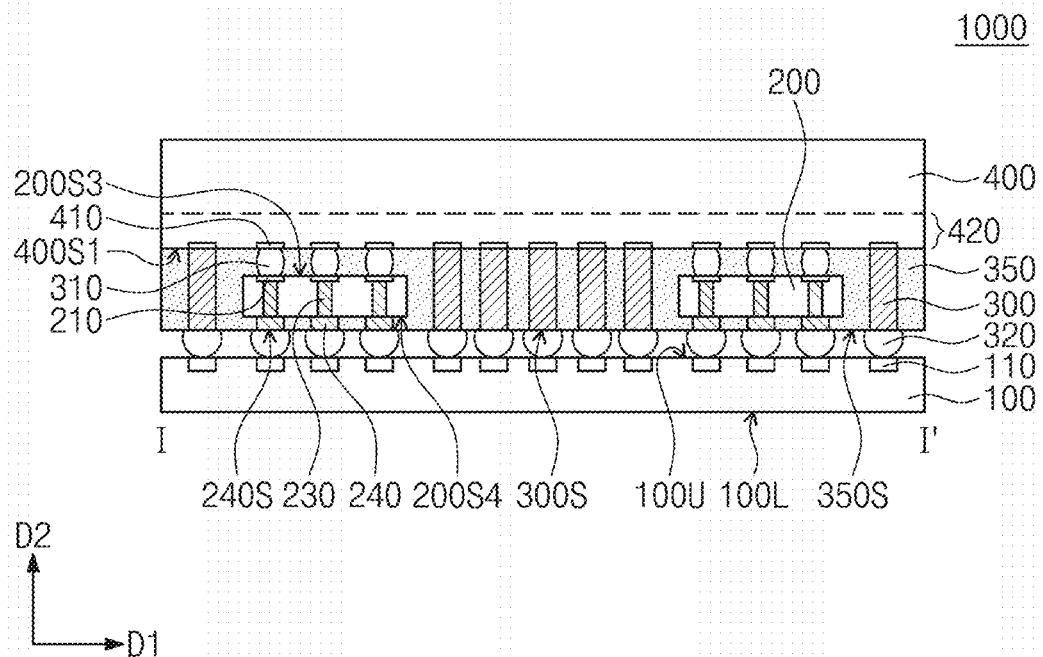

FIG. 5 illustrates a cross-sectional views taken along line I-I' of FIG. 1, showing an example of the semiconductor package 1000 according to some example embodiments of the present inventive concepts. For brevity of description, the following will focus on differences from the semiconductor package 1000 discussed above with reference to FIGS. 1 and 2.

Referring to FIGS. 1 and 5, the second semiconductor chip 200 may be disposed and connected to the first surface 400S1 of the first semiconductor chip 400. The third surface 200S3 of the second semiconductor chip 200 may face the first surface 400S1 of the first semiconductor chip 400, and the fourth surface 200S4 of the second semiconductor chip 200 may face the top surface 100U of the substrate 100. In some example embodiments, the second circuit layer (see 220 of FIG. 2) of the second semiconductor chip 200 may be adjacent to the third surface 200S3 or the fourth surface 200S4 of the second semiconductor chip 200.

Through electrodes 230 may be disposed in the second semiconductor chip 200, and conductive pads 240 may be disposed on the fourth surface 200S4 of the second semiconductor chip 200. Each of the through electrodes 230 may penetrate the second semiconductor chip 200, and may have connection with a corresponding one of the second chip pads 210 and a corresponding one of the conductive pads 240. The through electrodes 230 and the conductive pads 240 may include a conductive material.

Each of the conductive pads 240 may have a surface 240S that faces and is spaced apart from the top surface 100U of the substrate 100. The surface 300S of each of the conductive pillars 300 may face and be spaced apart from the top surface 100U of the substrate 100. The surface 240S of each of the conductive pads 240 may be located at substantially the same level as that of the surface 300S of each of the conductive pillars 300, from the first surface 400S1 of the first semiconductor chip 400, The mold layer 350 may cover lateral surfaces of the second semiconductor chip 200 and lateral surfaces of the conductive pillars 300, and may extend onto the fourth surface 200S4 of the second semiconductor chip 200 to thereby cover the conductive pads 240. The mold layer 350 may be spaced apart from the top surface 100U of the substrate 100, and the surface 350S of the mold layer 350 may be substantially coplanar with the surfaces 240S of the conductive pads 240 and with the surfaces 300S of the conductive pillars 300. The mold layer 350 may not cover but expose the surfaces 240S of the conductive pads 240 and the surfaces 300S of the conductive pillars 300.

The plurality of bumps 320 may be disposed between the substrate 100 and the conductive pillars 300 and between the substrate 100 and the conductive pads 240, and may be connected to the conductive pillars 300 and the conductive pads 240. The bumps 320 may be coupled to the substrate pads 110. Each of the conductive pillars and pads 300 and 240 may be connected to the substrate 100 through a corresponding one of the bumps 320.

The first semiconductor chip 400 may be electrically connected through the conductive pillars 300 to the substrate 100. In addition, at least one of the through electrodes 230 may be used for electrical connection between the first semiconductor chip 400 and the substrate 100. In this case, the first semiconductor chip 400 may be electrically connected to the substrate 100 through a corresponding one of the through electrodes 230 in the second semiconductor chip 200. The second semiconductor chip 200 may be electrically connected to the substrate 100 through a corresponding one of the through electrodes 230.

Figure 6:
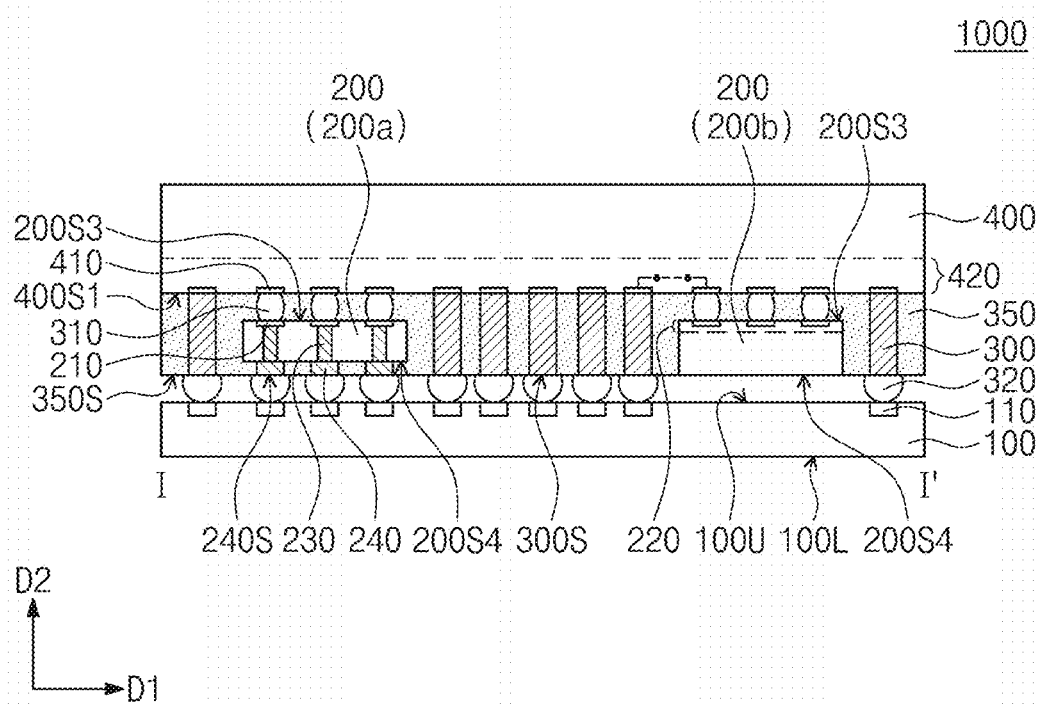

FIG. 6 illustrates a cross-sectional views taken along line I-I' of FIG. 1, showing an example of the semiconductor package 1000 according to some example embodiments of the present inventive concepts. For brevity of description, the following will focus on differences from the semiconductor package 1000 discussed above with reference to FIGS. 1 and 2.

Referring to FIGS. 1 and 6, the plurality of second semiconductor chips 200 may be disposed between the substrate 100 and the first semiconductor chip 400. The plurality of second semiconductor chips 200 may be placed on the first surface 400S1 of the first semiconductor chip 400 and may be horizontally spaced apart from each other along the first direction D1. Each of the plurality of second semiconductor chips 200 may be connected to the first surface 400S1 of the first semiconductor chip 400. Each of the plurality of second semiconductor chips 200 may include the third surface 200S3 and the fourth surface 200S4 opposite to each other. The third surface 200S3 of each of the plurality of second semiconductor chips 200 may face the first surface 400S1 of the first semiconductor chip 400, and the fourth surface 200S4 of each of the plurality of second semiconductor chips 200 may face the top surface 100U of the substrate 100. Each of the plurality of second semiconductor chips 200 may include the second circuit layer 220. The second circuit layer 220 included in one 200a of the plurality of second semiconductor chips 200 may be adjacent to the third surface 200S3 or the fourth surface 200S4. The second circuit layer 220 included in another second semiconductor chip 200b of the plurality of second semiconductor chips 200 may be adjacent to the third surface 200S3.

Through electrodes 230 may be disposed in the one 200a of the plurality of second semiconductor chips 200, and conductive pads 240 may be disposed on the fourth surface 200S4 of the one 200a of the plurality of second semiconductor chips 200. Each of the through electrodes 230 may penetrate the one 200a of the plurality of second semiconductor chips 200, and may have connection with a corresponding one of the second chip pads 210 and with a corresponding one of the conductive pads 240. Neither the through electrodes 230 nor the conductive pads 240 may be provided on the second semiconductor chip 200b of the plurality of second semiconductor chips 200.

Each of the conductive pads 240 may have a surface 240S that faces and is spaced apart from the top surface 100U of the substrate 100. The surface 300S of each of the conductive pillars 300 may face and be spaced apart from the top surface 100U of the substrate 100. The surface 240S of each of the conductive pads 240 may be located at substantially the same level as that of the surface 300S of each of the conductive pillars 300, from the first surface 400S1 of the first semiconductor chip 400. The fourth surface 200S4 of the second semiconductor chip 200b of the plurality of second semiconductor chips 200 may face and be spaced apart from the top surface 100U of the substrate 100. The fourth surface 200S4 of the second semiconductor chip 200b of the plurality of second semiconductor chips 200 may be located at substantially the same level as that of the surface 300S of each of the conductive pillars 300, from first surface 400S1 of the first semiconductor chip 400, but the present inventive concepts are not limited thereto.

The mold layer 350 may cover the plurality of second semiconductor chips 200 and the conductive pillars 300. The mold layer 350 may extend onto the fourth surface 200S4 of the one 200a of the plurality of second semiconductor chips 200, thereby covering the conductive pads 240. The mold layer 350 may be spaced apart from the top surface 100U of the substrate 100, and the surface 350S of the mold layer 350 may be substantially coplanar with the surfaces 240S of the conductive pads 240 and with the surfaces 300S of the conductive pillars 300. The mold layer 350 may not cover but expose the surfaces 240S of the conductive pads 240 and the surfaces 300S of the conductive pillars 300. In some example embodiments, the surface 350S of the mold layer 350 may be substantially coplanar with the fourth surface 200S4 of the second semiconductor chip 200b of the plurality of second semiconductor chips 200. In this case, the mold layer 350 may not cover but expose the fourth surface 200S4 of the second semiconductor chip 200b of the plurality of second semiconductor chips 200.

The plurality of bumps 320 may be disposed between the substrate 100 and the conductive pillars 300 and between the substrate 100 and the conductive pads 240, and may be connected to the conductive pillars 300 and the conductive pads 240. The bumps 320 may be coupled to the substrate pads 110. Each of the conductive pillars and pads 300 and 240 may be connected to the substrate 100 through a corresponding one of the bumps 320.

The first semiconductor chip 400 may be electrically connected through the conductive pillars 300 to the substrate 100. In addition, at least one of the through electrodes 230 may be used for electrical connection between the first semiconductor chip 400 and the substrate 100. In this case, the first semiconductor chip 400 may be electrically connected to the substrate 100 through a corresponding one of the through electrodes 230 in the one 200a of the plurality of second semiconductor chips 200.

The one 200a of the plurality of second semiconductor chips 200 may be electrically connected to the substrate 100 through a corresponding one of the through electrodes 230. The second semiconductor chip 200b of the plurality of second semiconductor chips 200 may include no through electrodes 230. In this case, the second semiconductor chip 200b of the plurality of second semiconductor chips 200 may be connected through internal wiring lines in the first semiconductor chip 400 to a corresponding one of the conductive pillars 300, and may be electrically connected to the substrate through the corresponding conductive pillar 300.

Figure 7:
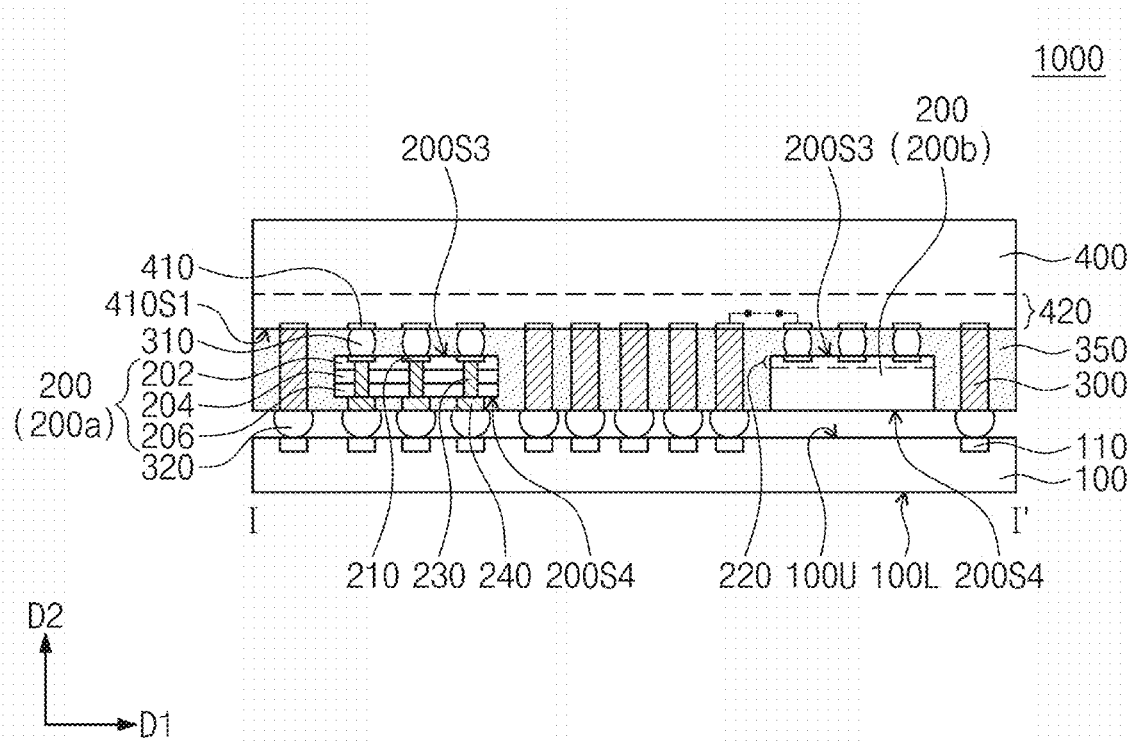

FIG. 7 illustrates a cross-sectional views taken along line I-I' of FIG. 1, showing an example of the semiconductor package 1000 according to some example embodiments of the present inventive concepts. For brevity of description, the following will focus on differences from the semiconductor package 1000 discussed above with reference to FIGS. 1 and 2.

Referring to FIGS. 1 and 7, the plurality of second semiconductor chips 200 may be disposed between the substrate 100 and the first semiconductor chip 400. The plurality of second semiconductor chips 200 may be disposed on the first surface 400S1 of the first semiconductor chip 400 and may be horizontally spaced apart from each other along the first direction D1. Each of the plurality of second semiconductor chips 200 may be connected to the first surface 400S1 of the first semiconductor chip 400.

One 200a of the plurality of second semiconductor chips 200 may include a plurality of sub-semiconductor chips 202, 204, and 206 that are stacked along the second direction D2 perpendicular to the first surface 400S1 of the first semiconductor chip 400. Each of the sub-semiconductor chips 202, 204, and 206 may be a logic chip or a memory chip. Through electrodes 230 may be disposed in the one 200a of the plurality of second semiconductor chips 200, and conductive pads 240 may be disposed on the fourth surface 200S4 of the one 200a of the plurality of second semiconductor chips 200. Each of the through electrodes 230 may penetrate the sub-semiconductor chips 202, 204, and 206 and may have connection with a corresponding one of the second chip pads 210 and a corresponding one of the conductive pads 240. The semiconductor package 1000 according to some example embodiments may be substantially the same as the semiconductor package 1000 discussed above with reference to FIGS. 1 and 6, except for the previously mentioned. Additionally, one of ordinary skill in the art may recognize the plurality of sub-semiconductor chips 202, 204, and 206 may be present in any of the second semiconductor chips 200a, and the number of sub-semiconductor chips is not limited to those shown.

Figure 8:
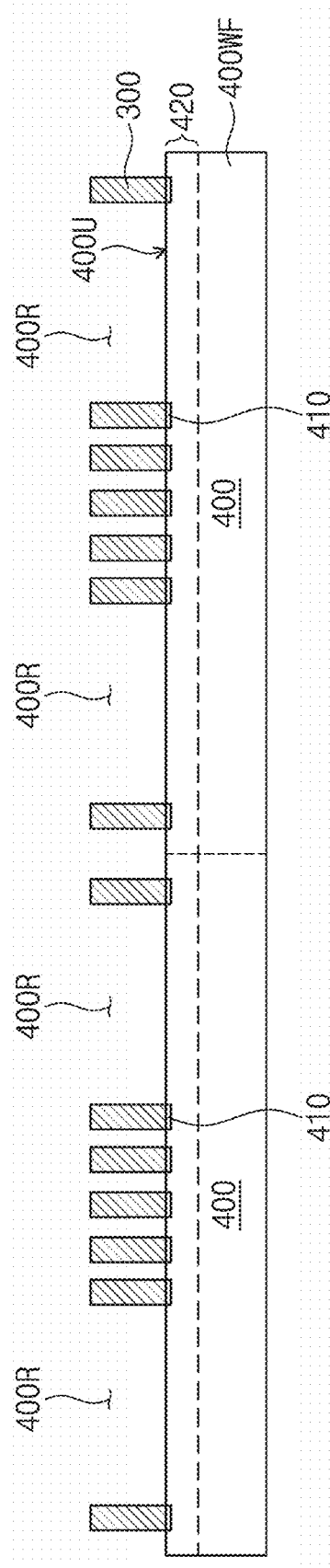
FIGS. 8 to 10 illustrate cross-sectional views showing a method of fabricating a semiconductor package according to some example embodiments of the present inventive concepts.
Figure 9:
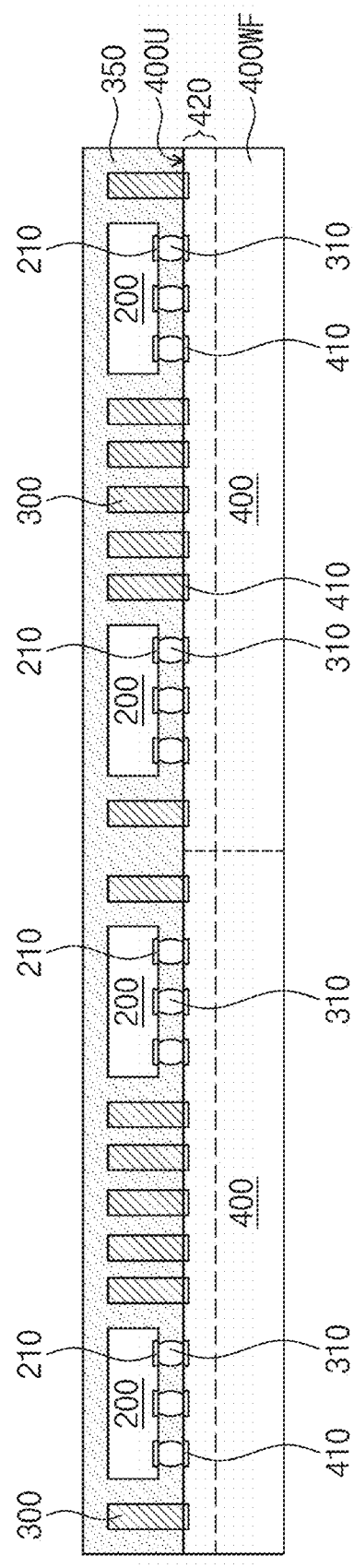
Figure 10:
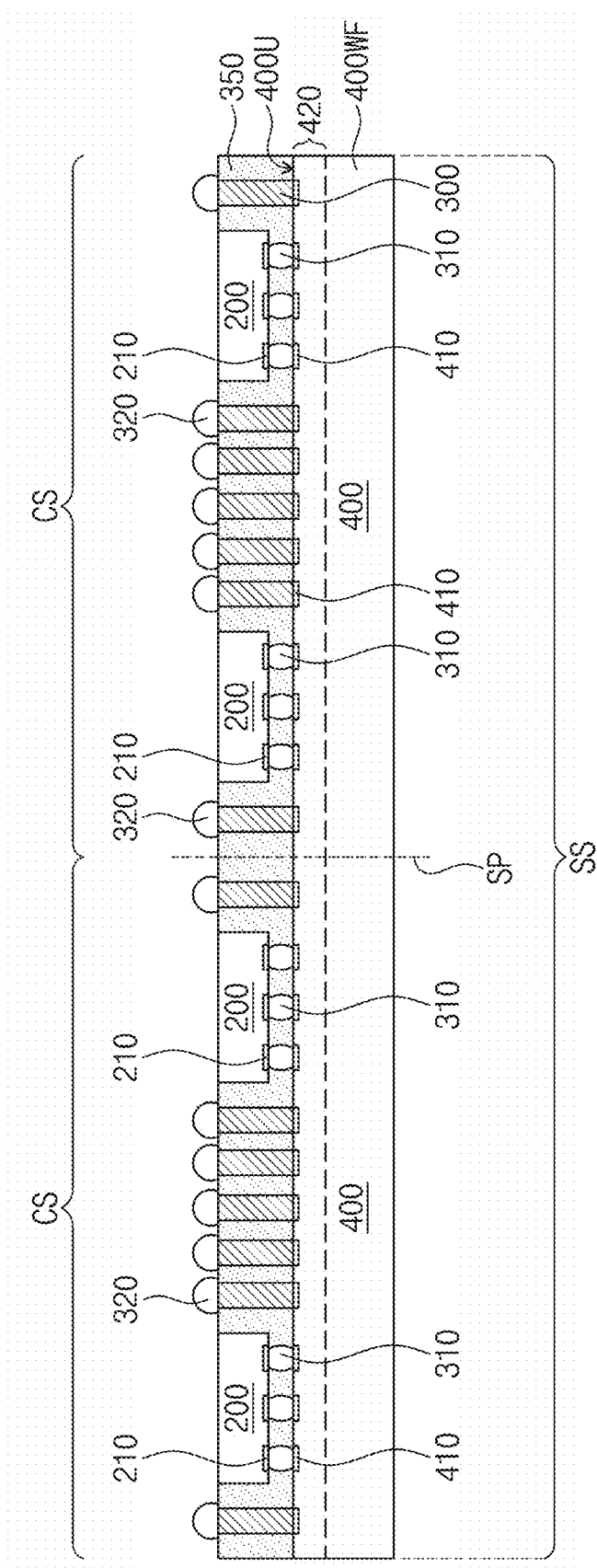

FIGS. 8 to 10 illustrate cross-sectional views showing a method of fabricating a semiconductor package according to some example embodiments of the present inventive concepts. Omission will be made to avoid duplicate explanation of the semiconductor package discussed above with reference to FIGS. 1 and 2.

Referring to FIG. 8, a wafer 400WF may be provided which includes a plurality of first semiconductor chips 400. The plurality of first semiconductor chips 400 may correspondingly include first circuit layers 420, and the first circuit layers 420 may be disposed adjacent to a top surface 400U of the wafer 400WF. The first circuit layers 420 may include integrated circuits. The plurality of first semiconductor chips 400 may include first chip pads 410, and the first chip pads 410 may be disposed adjacent to the top surface 400U of the wafer 400WF. The first chip pads 410 may be electrically connected to the first circuit layers 420.

A plurality of conductive pillars 300 may be formed on the top surface 400U of the wafer 400WF. Chip mount regions 400R may be previously defined on the top surface 400U of the wafer 400WF, and the conductive pillars 300 may be formed on the top surface 400U other than the chip mount regions 400R of the wafer 400WF. The conductive pillars 300 may be connected to corresponding ones of the first chip pads 410. The conductive pillars 300 may be formed by employing, for example, an electroplating process. For example, the formation of the conductive pillars 300 may include forming on the top surface 400U of the wafer 400WF a photoresist pattern having openings that expose regions where the conductive pillars 300 are formed, forming a seed layer on the photoresist pattern, and performing on the seed layer an electroplating process to form the conductive pillars 300. After the formation of the conductive pillars 300, the photoresist pattern may be removed.

Referring to FIG. 9, on the chip mount regions 400R, connectors 310 may be formed on the top surface 400U of the wafer 400WF. The connectors 310 may be formed on corresponding ones of the first chip pads 410 and may be connected to the corresponding first chip pads 410.

A plurality of second semiconductor chips 200 may be provided on corresponding chip mount regions 400R. Each of the plurality of second semiconductor chips 200 may include second chip pads 210, and the second chip pads 210 may be disposed adjacent to one surface of each of the second semiconductor chips 200. Each of the second semiconductor chips 200 may be provided on the top surface 400U of the wafer 400WF such that the second chip pads 210 may be in contact with corresponding ones of the connectors 310.

A mold layer 350 may be formed on the top surface 400U of the wafer 400WF, and may cover the second semiconductor chips 200 and the conductive pillars 300. In some example embodiments, the mold layer 350 may extend between the wafer 400WF and each of the second semiconductor chips 200, thereby covering the connectors 310. The mold layer 350 may fill a space between the connectors 310. In some example embodiments, before the mold layer 350 is formed, the under-fill layer 370 discussed in FIG. 3 may be formed to fill a space between the wafer 400WF and each of the second semiconductor chips 200 and to cover the connectors 310.

Referring to FIG. 10, the mold layer 350 may undergo a grinding process to remove an upper portion of the mold layer 350. The grinding process may expose one surface of each of the conductive pillars 300. In some example embodiments, the grinding process may expose one surface of each of the second semiconductor chips 200. In some example embodiments, the second semiconductor chips 200 may not be exposed by the grinding process, but may be covered with the mold layer 350, as discussed in FIG. 4.

A plurality of bumps 320 may be formed on the mold layer 350. The bumps 320 may be formed on corresponding conductive pillars 300 and may be connected to the corresponding conductive pillars 300. Through the process mentioned above, a stack structure SS may be formed. A sawing process SP may divide the stack structure SS into a plurality of chip stacks CS. The sawing process SP may separate the wafer 400WF into a plurality of first semiconductor chips 400, and the chip stacks CS may include corresponding first semiconductor chips 400. Each of the chip stacks CS may include one or more second semiconductor chips 200 stacked on the first semiconductor chip 400 and also include the conductive pillars 300 formed on the first semiconductor chip 400.

Referring back to FIGS. 1 and 2, one of the chip stacks CS may be provided on a substrate 100. The substrate 100 may be, for example, a printed circuit board (PCB). The substrate 100 may include substrate pads 110 disposed on a top surface 100U of the substrate 100. The chip stack CS may be stacked on the top surface 100U of the substrate 100 such that the bumps 320 may be in contact with corresponding ones of the substrate pads 110. The substrate 100 and the chip stack CS may comprise a semiconductor package 1000.

Figure 11:
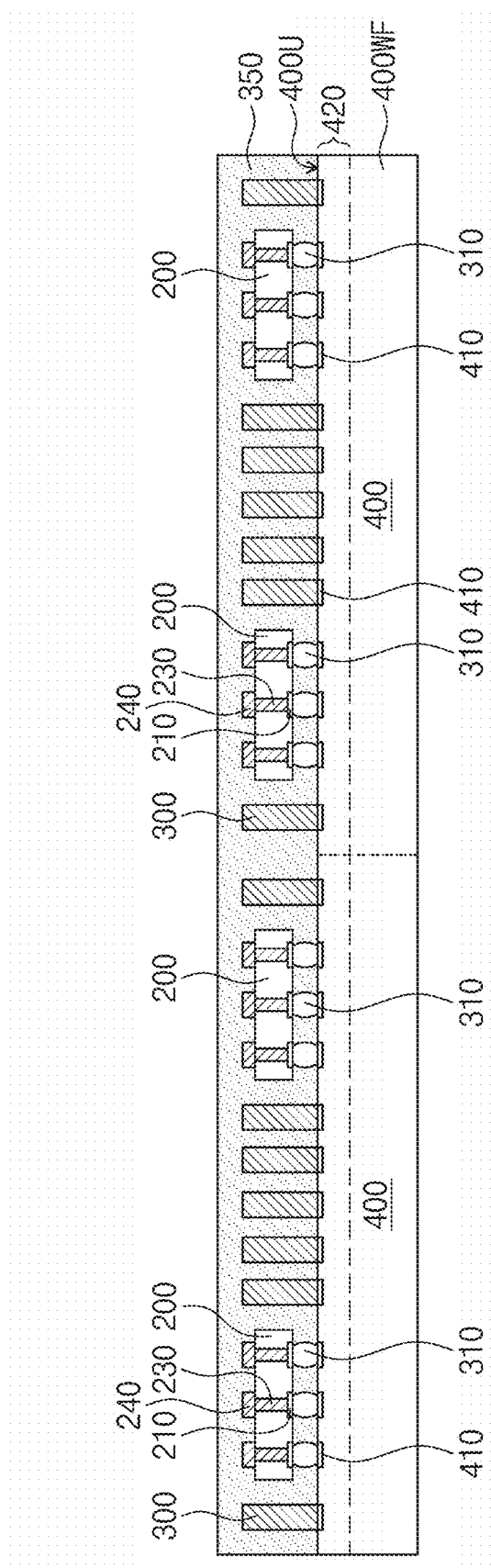
FIGS. 11 and 12 illustrate cross-sectional views showing a method of fabricating a semiconductor package according to some example embodiments of the present inventive concepts.
Figure 12:
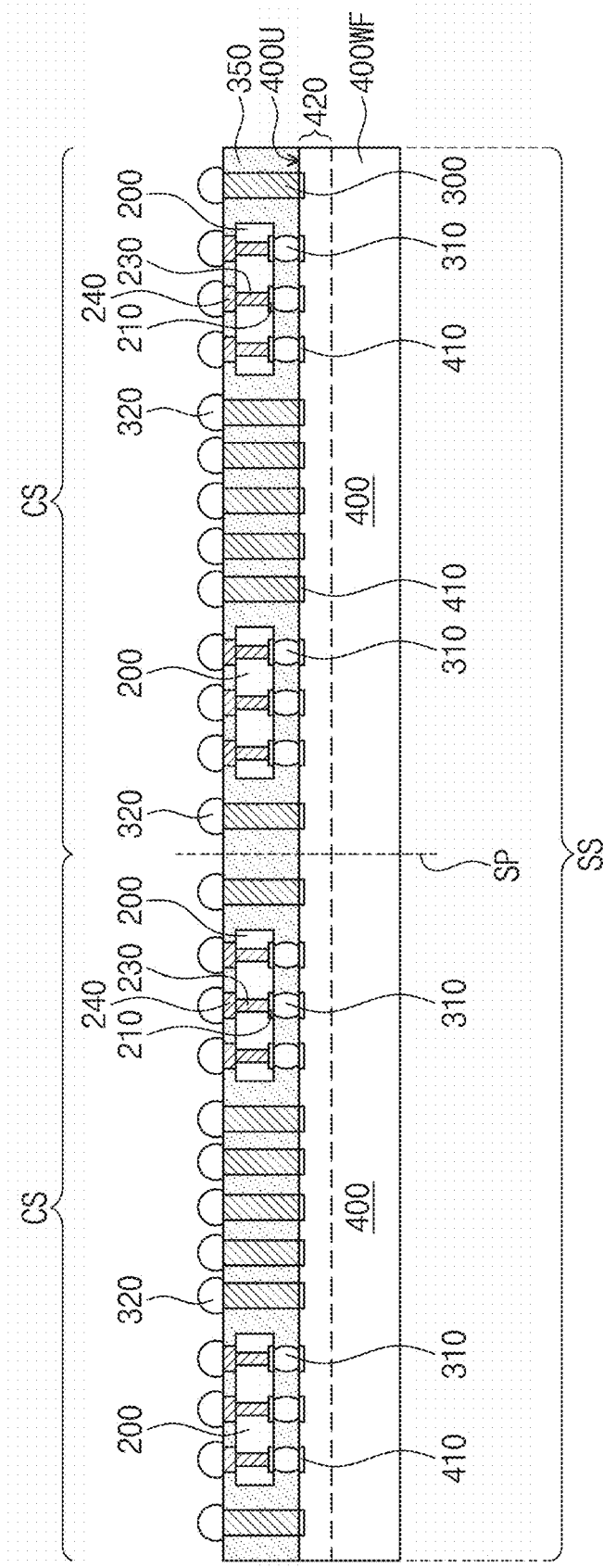

FIGS. 11 and 12 illustrate cross-sectional views showing a method of fabricating a semiconductor package according to some example embodiments of the present inventive concepts. The following will focus on differences from the semiconductor package fabrication method discussed above with reference to FIGS. 8 to 10.

First, as discussed above with reference to FIG. 8, the wafer 400WF may be provided which includes the plurality of first semiconductor chips 400, and the plurality of conductive pillars 300 may be formed on the top surface 400U of the wafer 400WF. The conductive pillars 300 may be formed on the top surface 400U other than the chip mount regions 400R of the wafer 400WF.

Referring to FIG. 11, on the chip mount regions 400R, connectors 310 may be formed on the top surface 400U of the wafer 400WF. The connectors 310 may be formed on corresponding ones of the first chip pads 410 and may be connected to the corresponding first chip pads 410.

A plurality of second semiconductor chips 200 may be provided on corresponding chip mount regions 400R. Each of the plurality of second semiconductor chips 200 may include second chip pads 210, and the second chip pads 210 may be disposed adjacent to one surface of each of the second semiconductor chips 200. In some example embodiments, each of the second semiconductor chips 200 may include through electrodes 230 penetrating therethrough, and also include conductive pads 240 disposed on other surface of each of the second semiconductor chips 200. The through electrodes 230 may penetrate each of the second semiconductor chips 200, and may have connection with the second chip pads 210 and the conductive pads 240. Each of the second semiconductor chips 200 may be provided on the top surface 400U of the wafer 400WF such that the second chip pads 210 may be in contact with corresponding ones of the connectors 310. A mold layer 350 may be formed on the top surface 400U of the wafer 400WF, and may cover the second semiconductor chips 200 and the conductive pillars 300.

Referring to FIG. 12, the mold layer 350 may undergo a grinding process to remove an upper portion of the mold layer 350. The grinding process may expose one surface of each of the conductive pillars 300 and one surface of each of the conductive pads 240. A plurality of bumps 320 may be formed on the mold layer 350.

The bumps 320 may be formed on corresponding conductive pillars 300 and corresponding conductive pads 240, and may be connected to the corresponding conductive pillars 300 and the corresponding conductive pads 240. Through the process mentioned above, a stack structure SS may be formed. A sawing process SP may divide the stack structure SS into a plurality of chip stacks CS. Other processes are substantially the same as the semiconductor package fabrication method discussed above with reference to FIGS. 1, 2, and 8 to 10.

Figure 13:
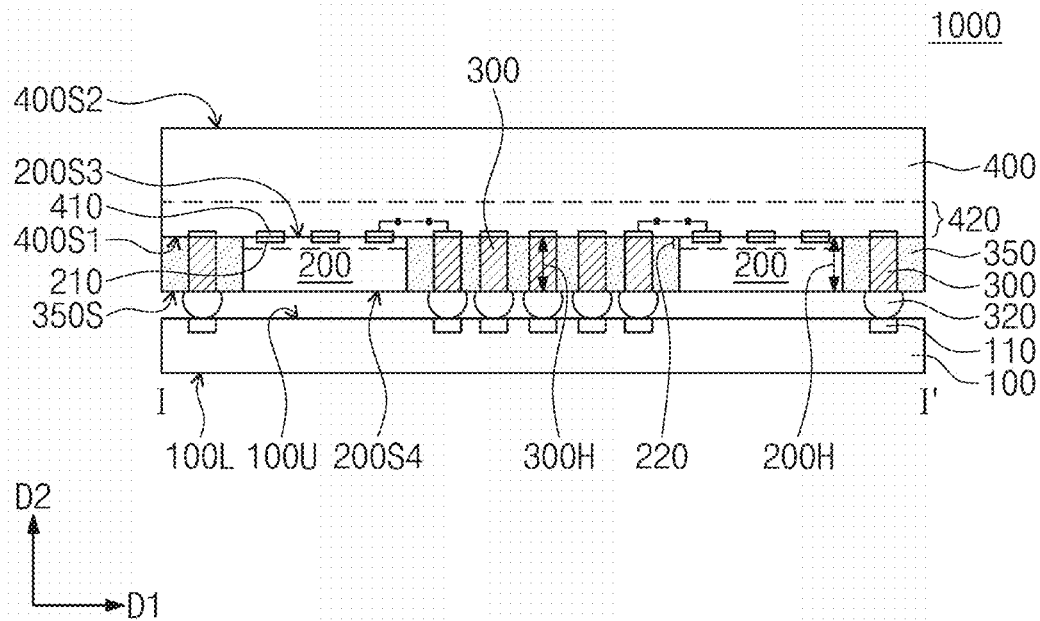
FIGS. 13 to 16 illustrate cross-sectional views taken along line I-I' of FIG. 1, showing a semiconductor package according to some example embodiments of the present inventive concepts.

FIG. 13 illustrates a cross-sectional views taken along line I-I' of FIG. 1, showing an example of the semiconductor package 1000 according to some example embodiments of the present inventive concepts.

Referring to FIGS. 1 and 13, the second chip pads 210 of the second semiconductor chip 200 may be in direct contact with corresponding ones of the first chip pads 410 of the first semiconductor chip 400. In some example embodiments, there may be no connectors 310 discussed above with reference to FIGS. 1 and 2. Each of the conductive pillars 300 of the second semiconductor chip 200 may have a height along the second direction D2 perpendicular to the first surface 400S1 of the first semiconductor chip 400. In some example embodiments, each of the conductive pillars 300 may have a height 300H substantially the same as a height 200H of the second semiconductor chip 200. The semiconductor package 1000 according to some example embodiments may be substantially the same as the semiconductor package 1000 discussed above with reference to FIGS. 1 and 2, except for the previously mentioned.

Figure 14:
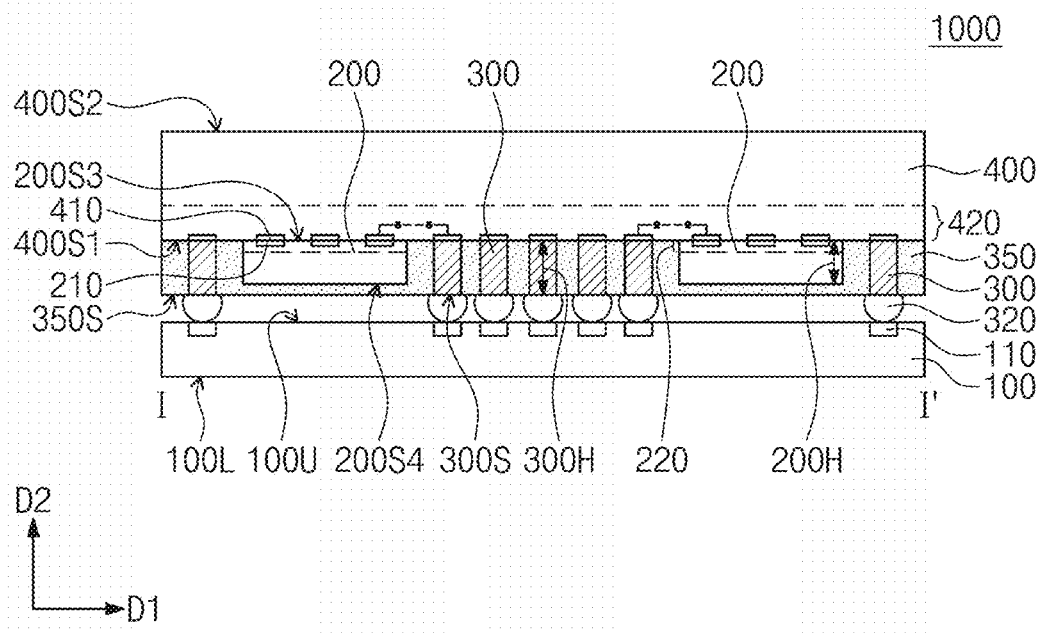

FIG. 14 illustrates a cross-sectional views taken along line I-I' of FIG. 1, showing an example of the semiconductor package 1000 according to some example embodiments of the present inventive concepts.

Referring to FIGS. 1 and 14, the second chip pads 210 of the second semiconductor chip 200 may be in direct contact with corresponding ones of the first chip pads 410 of the first semiconductor chip 400. In some example embodiments, there may be no connectors 310 discussed above with reference to FIGS. 1 and 2.

Each of the conductive pillars 300 of the second semiconductor chip 200 may have a height along the second direction D2 perpendicular to the first surface 400S1 of the first semiconductor chip 400. In some example embodiments, each of the conductive pillars 300 may have a height 300H greater than a height 200H of the second semiconductor chip 200. The surface 300S of each of the conductive pillars 300 may face and be spaced apart from the top surface 100U of the substrate 100. The surface 300S of each of the conductive pillars 300 may be positioned farther away from the first surface 400S1 of the first semiconductor chip 400 than from the fourth surface 200S4 of the second semiconductor chip 200. The semiconductor package 1000 according to some example embodiments may be substantially the same as the semiconductor package 1000 discussed above with reference to FIGS. 1 and 4, except for the previously mentioned.

Figure 15:
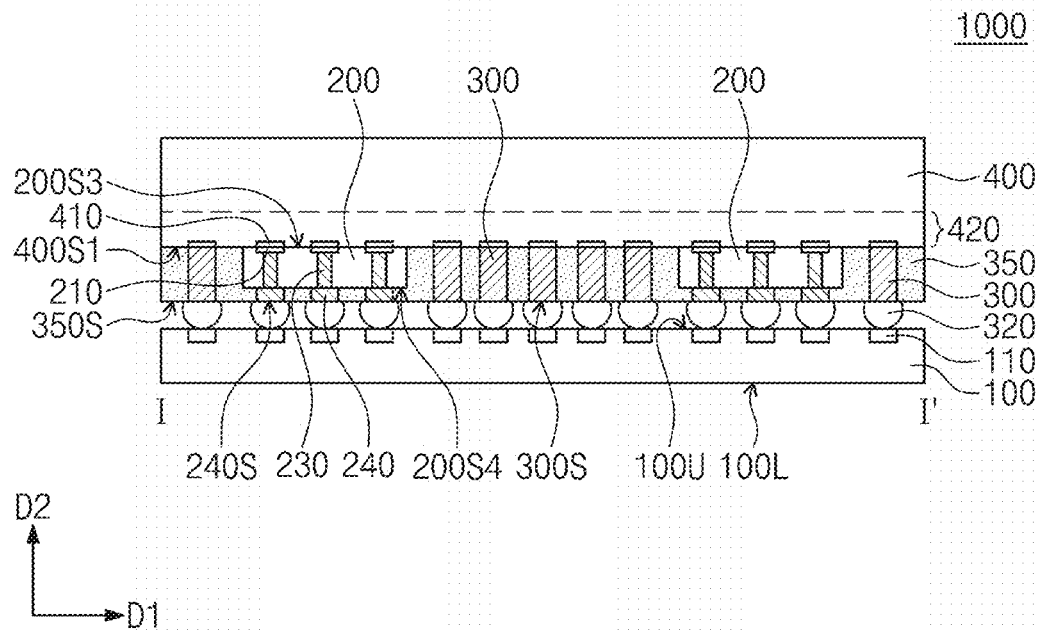

FIG. 15 illustrates a cross-sectional views taken along line I-I' of FIG. 1, showing an example of the semiconductor package 1000 according to some example embodiments of the present inventive concepts.

Referring to FIGS. 1 and 15, the second chip pads 210 of the second semiconductor chip 200 may be in direct contact with corresponding ones of the first chip pads 410 of the first semiconductor chip 400. In some example embodiments, there may be no connectors 310 discussed above with reference to FIGS. 1 and 2. The semiconductor package 1000 according to some example embodiments may be substantially the same as the semiconductor package 1000 discussed above with reference to FIGS. 1 and 5, except for the previously mentioned.

Figure 16:
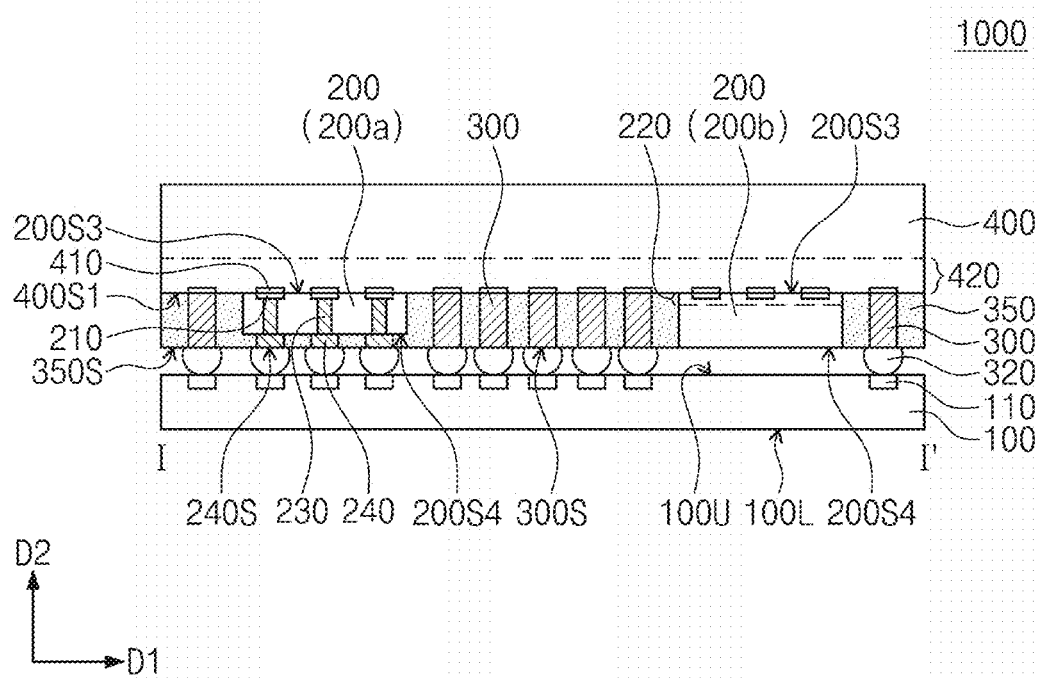

FIG. 16 illustrates a cross-sectional views taken along line I-I' of FIG. 1, showing an example of the semiconductor package 1000 according to some example embodiments of the present inventive concepts.

Referring to FIGS. 1 and 16, the plurality of second semiconductor chips 200 may be disposed between the substrate 100 and the first semiconductor chip 400. Each of the plurality of second semiconductor chips 200 may be connected to the first surface 400S1 of the first semiconductor chip 400. The second chip pads 210 of each of the plurality of second semiconductor chips 200 may be in direct contact with corresponding ones of the first chip pads 410 of the first semiconductor chip 400. The semiconductor package 1000 according to some example embodiments may be substantially the same as the semiconductor package 1000 discussed above with reference to FIGS. 1 and 6, except for the previously mentioned.

Figure 17:
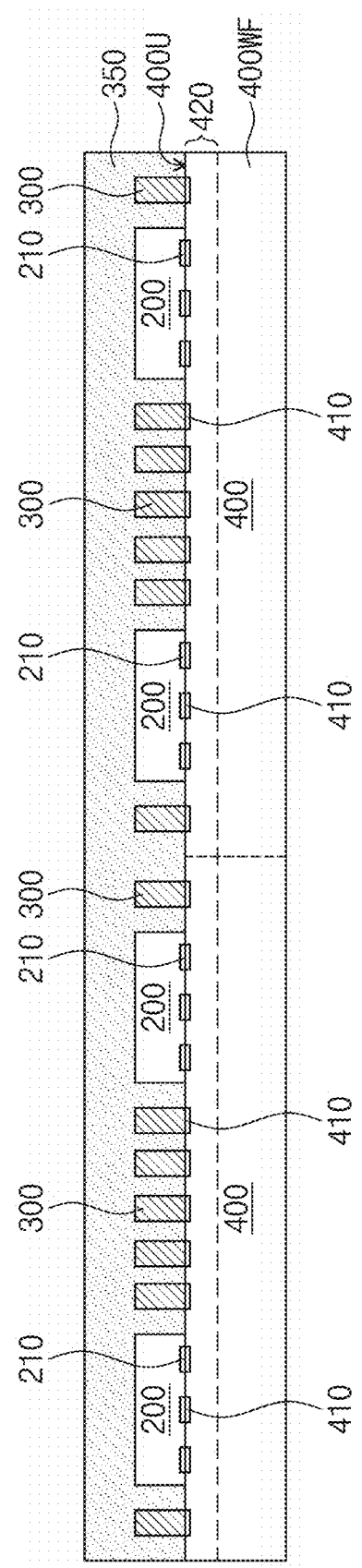
FIG. 17 illustrates a cross-sectional view showing a method of fabricating a semiconductor package according to some example embodiments of the present inventive concepts.

FIG. 17 illustrates a cross-sectional view showing a method of fabricating a semiconductor package according to some example embodiments of the present inventive concepts. The following will focus on differences from the semiconductor package fabrication method discussed above with reference to FIGS. 8 to 10.

First, as discussed above with reference to FIG. 8, the wafer 400WF may be provided which includes the plurality of first semiconductor chips 400, and the plurality of conductive pillars 300 may be formed on the top surface 400U of the wafer 400WF. The conductive pillars 300 may be formed on the top surface 400U other than the chip mount regions 400R of the wafer 400WF.

Referring to FIG. 17, a plurality of second semiconductor chips 200 may be provided on corresponding chip mount regions 400R. Each of the plurality of second semiconductor chips 200 may include second chip pads 210, and the second chip pads 210 may be disposed adjacent to one surface of each of the second semiconductor chips 200. Each of the second semiconductor chips 200 may be stacked on the top surface 400U of the wafer 400WF such that the second chip pads 210 may be in direct contact with corresponding ones of the first chip pads 410. Due to heat treatment, the second chip pads 210 of each of the second semiconductor chips 200 may be coupled (or bonded) to the corresponding first chip pads 410. A mold layer 350 may be formed on the top surface 400U of the wafer 400WF, and may cover the second semiconductor chips 200 and the conductive pillars 300. Other processes are substantially the same as the semiconductor package fabrication method discussed above with reference to FIGS. 1, 2, and 8 to 10.

Figure 18:
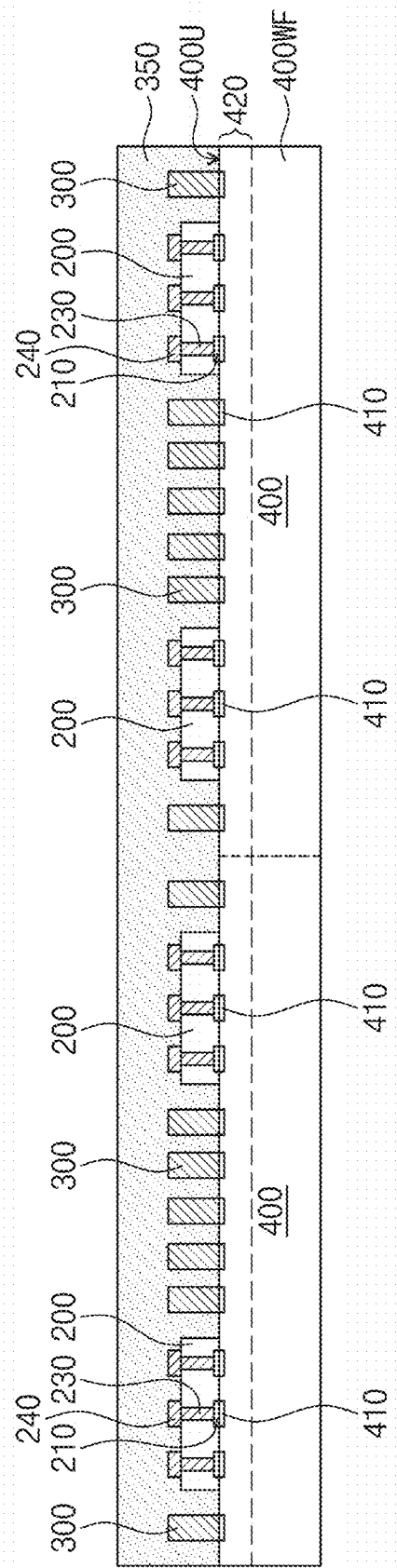
FIG. 18 illustrates a cross-sectional view showing a method of fabricating a semiconductor package according to some example embodiments of the inventive concepts.

FIG. 18 illustrates a cross-sectional view showing a method of fabricating a semiconductor package according to some example embodiments of the present inventive concepts. The following will focus on differences from the semiconductor package fabrication method discussed above with reference to FIGS. 8 to 10.

First, as discussed above with reference to FIG. 8, the wafer 400WF may be provided which includes the plurality of first semiconductor chips 400, and the plurality of conductive pillars 300 may be formed on the top surface 400U of the wafer 400WF. The conductive pillars 300 may be formed on the top surface 400U other than the chip mount regions 400R of the wafer 400WF.

Referring to FIG. 18, a plurality of second semiconductor chips 200 may be provided on corresponding chip mount regions 400R. Each of the plurality of second semiconductor chips 200 may include second chip pads 210, and the second chip pads 210 may be disposed adjacent to one surface of each of the second semiconductor chips 200. In some example embodiments, each of the second semiconductor chips 200 may include through electrodes 230 penetrating therethrough, and also include conductive pads 240 disposed on other surface of each of the second semiconductor chips 200. The through electrodes 230 may penetrate each of the second semiconductor chips 200, and may have connection with the second chip pads 210 and the conductive pads 240. Each of the second semiconductor chips 200 may be stacked on the top surface 400U of the wafer 400WF such that the second chip pads 210 may be in direct contact with corresponding ones of the first chip pads 410. Due to heat treatment, the second chip pads 210 of each of the second semiconductor chips 200 may be coupled (or bonded) to the corresponding first chip pads 410. A mold layer 350 may be formed on the top surface 400U of the wafer 400WF, and may cover the second semiconductor chips 200 and the conductive pillars 300. Other processes are substantially the same as the semiconductor package fabrication method discussed above with reference to FIGS. 1, 2, and 8 to 10.

Figure 19:
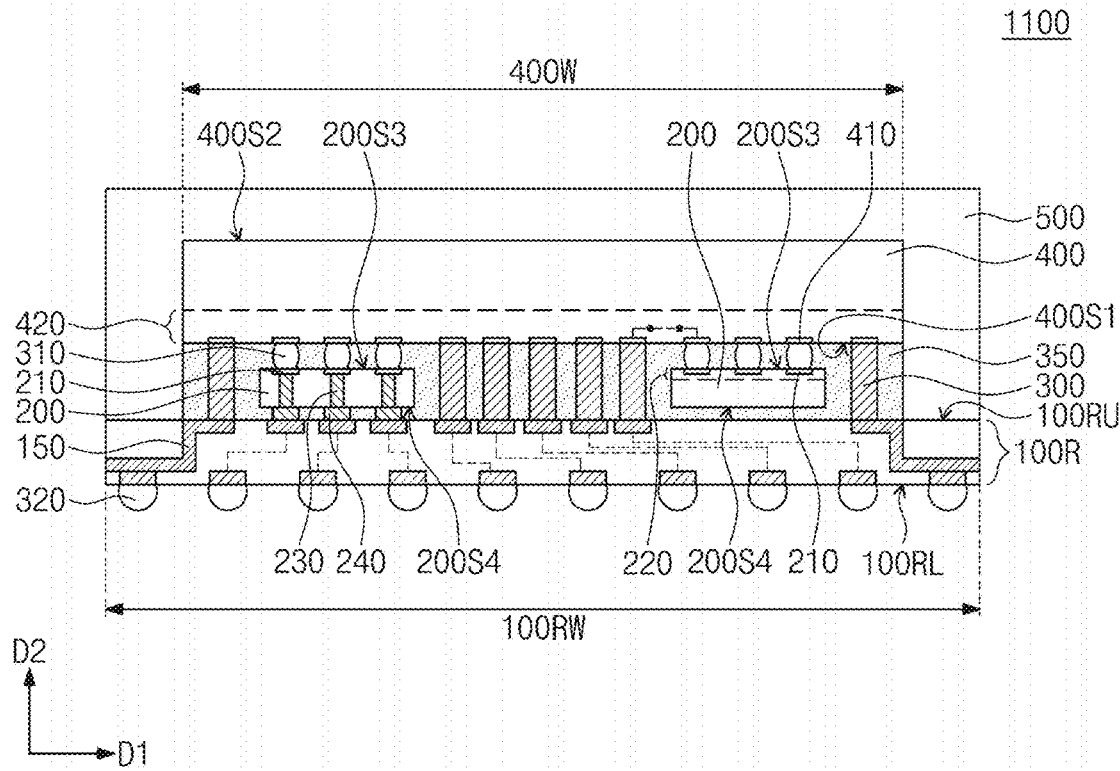
FIG. 19 illustrates a cross-sectional view showing a semiconductor package according to some example embodiments of the present inventive concepts.

FIG. 19 illustrates a cross-sectional view showing a semiconductor package 1100 according to some example embodiments of the present inventive concepts. For brevity of description, the following will focus on differences from the semiconductor package 1000 discussed above with reference to FIGS. 1 and 2.

Referring to FIG. 19, the first semiconductor chip 400 may be disposed on a redistribution layer 100R. The first semiconductor chip 400 may be disposed to allow the first surface 400S1 to face a top surface 100RU of the redistribution layer 100R. The redistribution layer 100R may include redistribution patterns 150. The redistribution patterns 150 may include a conductive material. Portions of the redistribution patterns 150 are indicated by dotted lines for brevity of illustration. The redistribution layer 100R and the first semiconductor chip 400 may each have a width in the first direction D1. The redistribution layer 100R may have a width 100RW greater than a width 400W of the first semiconductor chip 400. In this description, the redistribution layer 100R may called a substrate.

The second semiconductor chip 200 may be disposed between the redistribution layer 100R and the first semiconductor chip 400. The second semiconductor chip 200 may be disposed on and connected to the first surface 400S1 of the first semiconductor chip 400. In some example embodiments, a plurality of second semiconductor chips 200 may be disposed between the redistribution layer 100R and the first semiconductor chip 400. The plurality of second semiconductor chips 200 may be disposed on the first surface 400S1 of the first semiconductor chip 400 and may be horizontally spaced apart from each other along the first direction D1 parallel to the first surface 400S1. Each of the plurality of second semiconductor chips 200 may be connected to the first surface 400S1 of the first semiconductor chip 400.

In some example embodiments, through electrodes 230 may be disposed in at least one of the plurality of second semiconductor chips 200, and conductive pads 240 may be disposed on the fourth surface 200S4 of the at least one of the plurality of second semiconductor chips 200. Each of the through electrodes 230 may penetrate the at least one of the plurality of second semiconductor chips 200, and may have connection with a corresponding one of the second chip pads 210 and a corresponding one of the conductive pads 240. In some example embodiments, neither the through electrodes 230 nor the conductive pads 240 may be provided on another one of the plurality of second semiconductor chips 200, but the present inventive concepts are not limited thereto.

The plurality of conductive pillars 300 may be disposed between the redistribution layer 100R and the first semiconductor chip 400. Each of the conductive pillars 300 may be connected to the first surface 400S1 of the first semiconductor chip 400. For example, the conductive pillars 300 may be connected to corresponding ones of the first chip pads 410 of the first semiconductor chip 400.

The mold layer 350 may be disposed between the redistribution layer 100R and the first semiconductor chip 400, and may cover lateral surfaces of the second semiconductor chip 200 and lateral surfaces of the conductive pillars 300. The mold layer 350 may extend onto the fourth surface 200S4 of each of the plurality of second semiconductor chips 200, thereby covering the fourth surface 200S4. The mold layer 350 may extend onto the fourth surface 200S4 of the at least one of the plurality of second semiconductor chips 200, thereby covering the conductive pads 240. The mold layer 350 may be in contact with the top surface 100RU of the redistribution layer 100R. The conductive pillars 300 and the conductive pads 240 may each penetrate at least a portion of the mold layer 350 and have connection with a corresponding one of the redistribution patterns 150.

The plurality of bumps 320 may be disposed on a bottom surface 100RL of the redistribution layer 100R. Each of the plurality of bumps 320 may be connected to a corresponding one of the redistribution patterns 150. The conductive pillars 300 and the conductive pads 240 may each be electrically connected through a corresponding redistribution pattern 150 to a corresponding one of the plurality of bumps 320.

The first semiconductor chip 400 may be electrically connected through the conductive pillars 300 to the redistribution layer 100R. In addition, at least one of the through electrodes 230 may be used for electrical connection between the first semiconductor chip 400 and the redistribution layer 100R. In this case, the first semiconductor chip 400 may be electrically connected to the redistribution layer 100R through a corresponding one of the through electrodes 230 in the at least one of the plurality of second semiconductor chips 200.

The at least one of the plurality of second semiconductor chips 200 may be electrically connected to the redistribution layer 100R through a corresponding one of the through electrodes 230. Another one of the plurality of second semiconductor chips 200 may be connected through an internal wiring line in the first semiconductor chip 400 to a corresponding one of the conductive pillars 300, and may be electrically connected to the redistribution layer 100R through the corresponding conductive pillar 300.

The redistribution layer 100R may be provided thereon with an additional mold layer 500 that covers the first semiconductor chip 400 and the mold layer 350. The additional mold layer 500 may extend along sidewalls of the first semiconductor chip 400 and the mold layer 350 and may be in contact with the top surface 100RU of the redistribution layer 100R. The additional mold layer 500 may include a dielectric material (e.g., epoxy-based molding compound). In some example embodiments, the additional mold layer 500 may be omitted. The semiconductor package 1100 according to some example embodiments may comprise a fan-out wafer level package.

Figure 20:
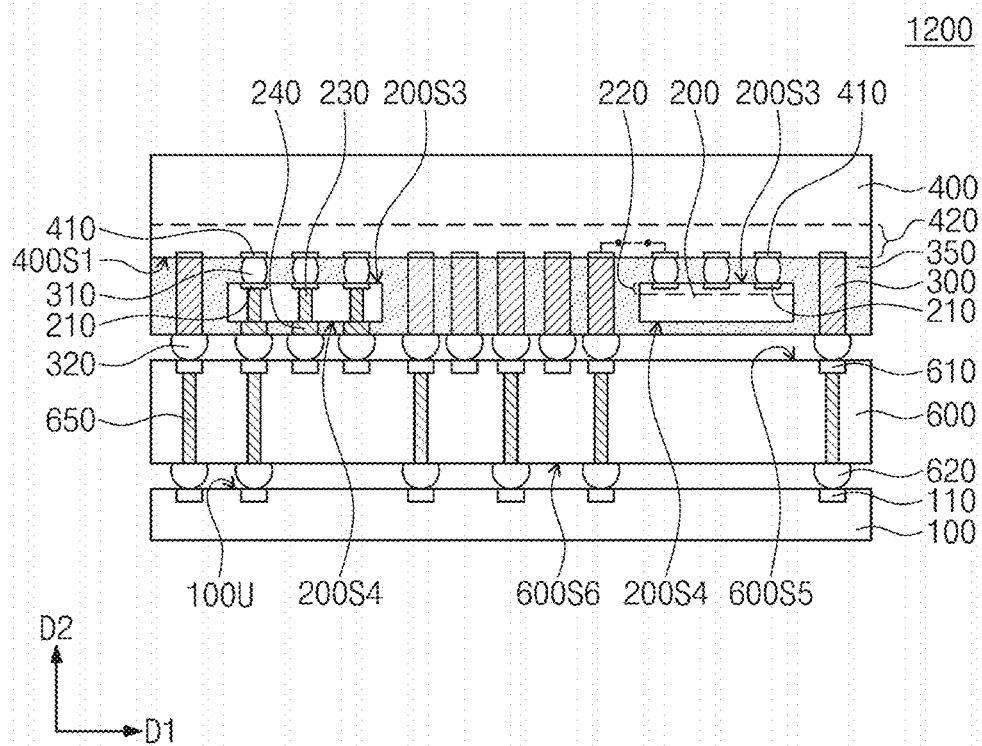
FIG. 20 illustrates a cross-sectional view showing a semiconductor package according to some example embodiments of the present inventive concepts.

FIG. 20 illustrates a cross-sectional view showing a semiconductor package 1200 according to some example embodiments of the present inventive concepts. For brevity of description, the following will focus on differences from the semiconductor package 1000 discussed above with reference to FIGS. 1 and 2.

Referring to FIG. 20, a lower semiconductor chip 600 may be disposed on the substrate 100. The substrate 100 may be, for example, a printed circuit board (PCB). The substrate 100 may include substrate pads 110, and the substrate pads 110 may be disposed on a top surface 100U of the substrate 100.

The lower semiconductor chip 600 may have a fifth surface 600S5 and a sixth surface 600S6, and may include lower chip pads 610 disposed on the fifth surface 600S5. The lower chip pads 610 may include a conductive material. The lower semiconductor chip 600 may be disposed to allow the sixth surface 600S6 to face the top surface 100U of the substrate 100. The lower semiconductor chip 600 may be a logic chip or a memory chip.

Lower through electrodes 650 may be disposed in the lower semiconductor chip 600, and lower bumps 620 may be disposed on the sixth surface 600S6 of the lower semiconductor chip 600. Each of the lower through electrodes 650 may penetrate the lower semiconductor chip 600, and may have connection with a corresponding one of the lower chip pads 610 and a corresponding one of the lower bumps 620. Each of the lower bumps 620 may be connected to a corresponding one of the substrate pads 110. The lower through electrodes 650 and the lower bumps 620 may include a conductive material.

The first semiconductor chip 400 may be disposed on the lower semiconductor chip 600. The first semiconductor chip 400 may be disposed to allow the first surface 400S1 to face the fifth surface 600S5 of the lower semiconductor chip 600. The second semiconductor chip 200 may be disposed between the lower semiconductor chip 600 and the first semiconductor chip 400. The second semiconductor chip 200 may be disposed on and connected to the first surface 400S1 of the first semiconductor chip 400. In some example embodiments, a plurality of second semiconductor chips 200 may be disposed between the lower semiconductor chip 600 and the first semiconductor chip 400. The plurality of second semiconductor chips 200 may be disposed on the first surface 400S1 of the first semiconductor chip 400 and may be horizontally spaced apart from each other along the first direction D1 parallel to the first surface 400S1. Each of the plurality of second semiconductor chips 200 may be connected to the first surface 400S1 of the first semiconductor chip 400.

In some example embodiments, through electrodes 230 may be disposed in at least one of the plurality of second semiconductor chips 200, and conductive pads 240 may be disposed on the fourth surface 200S4 of the at least one of the plurality of second semiconductor chips 200. Each of the through electrodes 230 may penetrate the at least one of the plurality of second semiconductor chips 200, and may have connection with a corresponding one of the second chip pads 210 and a corresponding one of the conductive pads 240. In some example embodiments, neither the through electrodes 230 nor the conductive pads 240 may be provided on another one of the plurality of second semiconductor chips 200, but the present inventive concepts are not limited thereto.

The plurality of conductive pillars 300 may be disposed between the lower semiconductor chip 600 and the first semiconductor chip 400. Each of the conductive pillars 300 may be connected to the first surface 400S1 of the first semiconductor chip 400. For example, the conductive pillars 300 may be connected to corresponding ones of the first chip pads 410 of the first semiconductor chip 400.

The mold layer 350 may be disposed between the lower semiconductor chip 600 and the first semiconductor chip 400, and may cover the second semiconductor chips 200 and the conductive pillars 300. The mold layer 350 may extend onto the fourth surface 200S4 of the at least one of the plurality of second semiconductor chips 200, thereby covering the conductive pads 240. The mold layer 350 may be spaced apart from the fifth surface 600S5 of the lower semiconductor chip 600.

The plurality of bumps 320 may be disposed between the lower semiconductor chip 600 and the conductive pillars 300 and between the lower semiconductor chip 600 and the conductive pads 240, and may be connected to the conductive pillars 300 and the conductive pads 240. The bumps 320 may be connected to the lower chip pads 610 of the lower semiconductor chip 600. The conductive pillars 300 and the conductive pads 240 may each be connected to the lower semiconductor chip 600 through a corresponding one of the bumps 320.

The first semiconductor chip 400 may be electrically connected through the conductive pillars 300 to the lower semiconductor chip 600. At least one of the through electrodes 230 may be used for electrical connection between the first semiconductor chip 400 and the lower semiconductor chip 600. In this case, the first semiconductor chip 400 may be electrically connected to the lower semiconductor chip 600 through a corresponding one of the through electrodes 230 in the at least one of the plurality of second semiconductor chips 200. In addition, at least one of the lower through electrodes 650 may be used for electrical connection between the first semiconductor chip 400 and the substrate 100. In this case, the first semiconductor chip 400 may be electrically connected to the substrate 100 through a corresponding one of the lower through electrodes 650 in the lower semiconductor chip 600.

The at least one of the plurality of second semiconductor chips 200 may be electrically connected to the lower semiconductor chip 600 through a corresponding one of the through electrodes 230. Another one of the plurality of second semiconductor chips 200 may be connected through an internal wiring line in the first semiconductor chip 400 to a corresponding one of the conductive pillars 300, and may be electrically connected through the corresponding conductive pillar 300 to the lower semiconductor chip 600. One or more of the lower through electrodes 650 may be used for electrical connection between the substrate 100 and the plurality of second semiconductor chips 200. In this case, the plurality of second semiconductor chips 200 may be electrically connected to the substrate 100 through corresponding ones of the lower through electrodes 650 in the lower semiconductor chip 600. The lower semiconductor chip 600 may be electrically connected to the substrate 100 through corresponding ones of the lower through electrodes 650.

Figure 21:
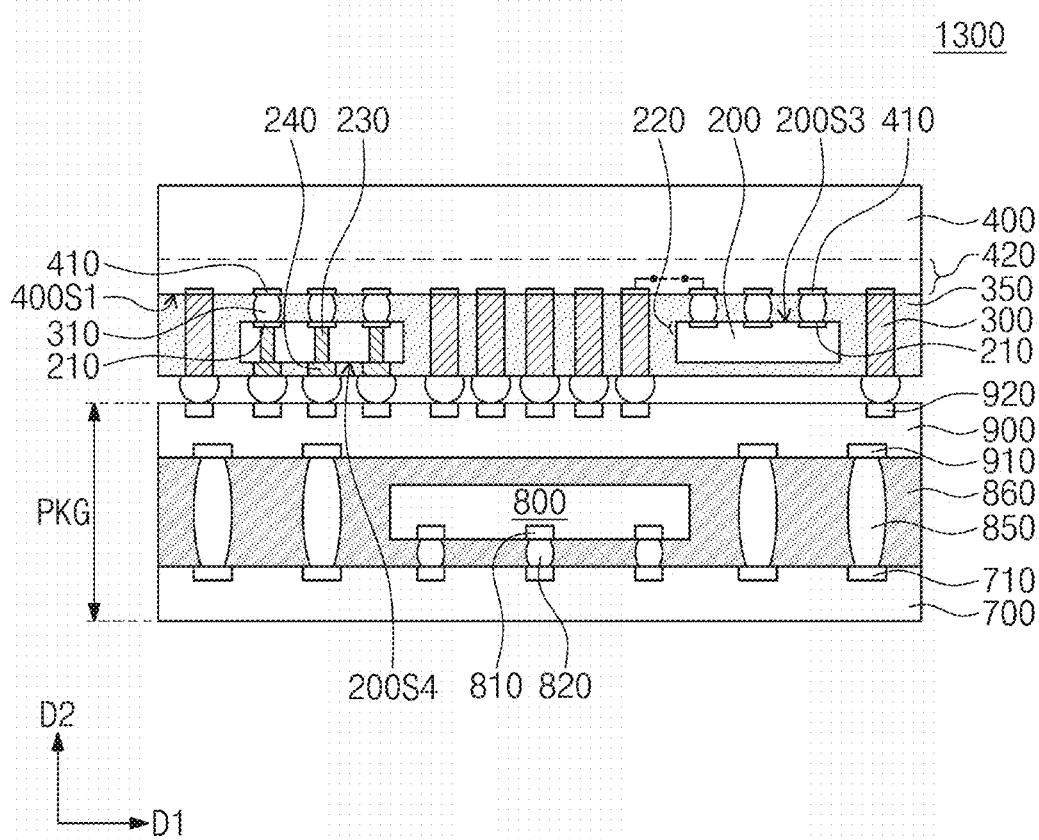
FIG. 21 illustrates a cross-sectional view showing a semiconductor package according to some example embodiments of the present inventive concepts.

FIG. 21 illustrates a cross-sectional view showing a semiconductor package 1300 according to some example embodiments of the present inventive concepts. For brevity of description, the following will focus on differences from the semiconductor package 1000 discussed above with reference to FIGS. 1 and 2.

Referring to FIG. 21, a lower semiconductor package PKG may be provided. The lower semiconductor package PKG may include a first substrate 700 and a semiconductor chip 800 on the first substrate 700. The first substrate 700 may be a redistribution layer or a printed circuit substrate having a circuit pattern. The first substrate 700 may include first substrate pads 710. The first substrate pads 710 may include a conductive material. The semiconductor chip 800 may include chip pads 810 disposed on a bottom surface thereof. The first substrate 700 and the semiconductor chip 800 may have therebetween lower connectors 820 that are correspondingly connected to the chip pads 810. The lower connectors 820 may be connected to corresponding ones of the first substrate pads 710. The chip pads 810 and the lower connectors 820 may include a conductive material. The lower connectors 820 may have one or more of a solder ball shape, a bump shape, and a pillar shape. The semiconductor chip 800 may include integrated circuits (not shown), and the integrated circuits may be adjacent to the bottom surface of the semiconductor chip 800. The semiconductor chip 800 may be a logic chip or a memory chip.

The lower semiconductor package PKG may include solder structures 850 on the first substrate 700. The solder structures 850 may be horizontally spaced apart from the semiconductor chip 800. The solder structures 850 may be connected to corresponding ones of the first substrate pads 710. The solder structures 850 may include a conductive material, such as tin, lead, silver, and/or an alloy thereof. Each of the solder structures 850 may be electrically connected to an external terminal or the semiconductor chip 800 through an internal wiring line in the first substrate 700.

The lower semiconductor package PKG may include a second substrate 900 disposed on the semiconductor chip 800. The second substrate 900 may be, for example, an interposer substrate. The second substrate 900 may include first pads 910 disposed on a bottom surface of the second substrate 900 and also include second pads 920 disposed on a top surface of the second substrate 900. The second substrate 900 may be provided therein with wiring lines that electrically connect the first pads 910 to the second pads 920. The first pads 910 and the second pads 920 may include a conductive material such as metal (e.g., copper and/or aluminum). The solder structures 850 may be connected to the first pads 910. The second substrate 900 may be electrically connected through the solder structures 850 to the first substrate 700 and the semiconductor chip 800.

The lower semiconductor package PKG may include a lower mold layer 860 between the first substrate 700 and the second substrate 900. The lower mold layer 860 may cover the semiconductor chip 800 and the solder structures 850. The lower mold layer 860 may extend between the first substrate 700 and the semiconductor chip 800, thereby encapsulating the lower connectors 820. The lower mold layer 860 may include a dielectric material (e.g., epoxy-based molding compound).

The first semiconductor chip 400 may be disposed on the second substrate 900 of the lower semiconductor package PKG. The first semiconductor chip 400 may be disposed to allow the first surface 400S1 to face the second substrate 900. The second semiconductor chip 200 may be disposed between the second substrate 900 and the first semiconductor chip 400. In some example embodiments, a plurality of second semiconductor chips 200 may be disposed between the second substrate 900 and the first semiconductor chip 400.

In some example embodiments, through electrodes 230 may be disposed in at least one of the plurality of second semiconductor chips 200, and conductive pads 240 may be disposed on the fourth surface 200S4 of the at least one of the plurality of second semiconductor chips 200. Each of the through electrodes 230 may penetrate the at least one of the plurality of second semiconductor chips 200, and may have connection with a corresponding one of the second chip pads 210 and a corresponding one of the conductive pads 240. In some example embodiments, neither the through electrodes 230 nor the conductive pads 240 may be provided on another one of the plurality of second semiconductor chips 200, but the present inventive concepts are not limited thereto.

The plurality of conductive pillars 300 may be disposed between the second substrate 900 and the first semiconductor chip 400. Each of the conductive pillars 300 may be connected to the first surface 400S1 of the first semiconductor chip 400. For example, the conductive pillars 300 may be connected to corresponding ones of the first chip pads 410 of the first semiconductor chip 400.

The mold layer 350 may be disposed between the second substrate 900 and the first semiconductor chip 400, and may cover the second semiconductor chip 200 and the conductive pillars 300. The mold layer 350 may extend onto the fourth surface 200S4 of the at least one of the plurality of second semiconductor chips 200, thereby covering the conductive pads 240. The mold layer 350 may be spaced apart from the second substrate 900.

The plurality of bumps 320 may be disposed between the second substrate 900 and the conductive pillars 300 and between the second substrate 900 and the conductive pads 240, and may be connected to the conductive pillars 300 and the conductive pads 240. The bumps 320 may be connected to the second pads 920 of the second substrate 900. The conductive pillars 300 and the conductive pads 240 may each be connected to the second substrate 900 through a corresponding one of the bumps 320.

The first semiconductor chip 400 may be electrically connected through the conductive pillars 300 to the lower semiconductor package PKG. At least one of the through electrodes 230 may be used for electrical connection between the first semiconductor chip 400 and the lower semiconductor package PKG. In this case, the first semiconductor chip 400 may be electrically connected to the lower semiconductor package PKG through a corresponding one of the through electrodes 230 in the at least one of the plurality of second semiconductor chips 200.

The at least one of the plurality of second semiconductor chips 200 may be electrically connected to the lower semiconductor package PKG through a corresponding one of the through electrodes 230. Another one of the plurality of second semiconductor chips 200 may be connected through an internal wiring line in the first semiconductor chip 400 to a corresponding one of the conductive pillars 300, and may be electrically connected through the corresponding conductive pillar 300 to the lower semiconductor package PKG.

According to the some example embodiments, the first semiconductor chip 400, whose width is relatively large, may be disposed in an upper region of the semiconductor package 1000/1100/1200/1300. Therefore, heat may be easily discharged outwardly from the first semiconductor chip 400. In addition, the semiconductor package 1000/1100/1200/1300 may include the conductive pillars 300 that electrically connect the first semiconductor chip 400 to a lower structure (e.g., the substrate 100, the redistribution layer 100R, the lower semiconductor chip 600, or the lower semiconductor package PKG). Because the first semiconductor chip 400 is electrically connected through the conductive pillars 300 to the lower structure, the first semiconductor chip 400 may require no through electrode therein. As a result, a semiconductor package may be capable of easily stacking a plurality of semiconductor chips with excellent reliability.

The aforementioned description provides some example embodiments for explaining the present inventive concepts. Therefore, the present inventive concepts are not limited to the embodiments described above, and it will be understood by one of ordinary skill in the art that variations in form and detail may be made therein without departing from the spirit and essential features of the present inventive concepts.

What is claimed is:

1. A semiconductor package, comprising:
   a first semiconductor chip;
   a plurality of second semiconductor chips on a first surface of the first semiconductor chip and horizontally spaced apart from each other;
   a plurality of conductive pillars on the first surface of the first semiconductor chip and adjacent to at least one side of the plurality of second semiconductor chips; and
   a substrate,
   wherein the first semiconductor chip includes a first circuit layer adjacent to the first surface of the first semiconductor chip,
   wherein the plurality of second semiconductor chips and the plurality of conductive pillars are connected to the first surface of the first semiconductor chip,
   wherein one of the plurality of second semiconductor chips is separated from the substrate and electrically connected to the substrate through at least one of the plurality of conductive pillars, and having no conductive pads between the one of the plurality of second semiconductor chips and the substrate, and
   wherein another of the plurality of second semiconductor chips includes a through electrode penetrating the another of the plurality of second semiconductor chips, and is electrically connected to the substrate through the through electrode.

2. The semiconductor package of claim 1, wherein each of the first and second semiconductor chips has a width along a first direction parallel to the first surface,
   wherein the width of the first semiconductor chip is greater than the width of each of the plurality of second semiconductor chips.

3. The semiconductor package of claim 1, wherein the first surface of the first semiconductor chip faces a top surface of the substrate, and
   the plurality of second semiconductor chips and the plurality of conductive pillars are between the first surface of the first semiconductor chip and the top surface of the substrate.

4. The semiconductor package of claim 3, wherein the plurality of conductive pillars are connected to the substrate.

5. The semiconductor package of claim 4, wherein
   each of the plurality of second semiconductor chips has a height along a second direction perpendicular to the first surface, and
   each of the plurality of conductive pillars has a height along the second direction,
   wherein the height of each of the plurality of conductive pillars is the same as or greater than the height of each of the plurality of second semiconductor chips.

6. The semiconductor package of claim 4, wherein
   the first semiconductor chip includes a plurality of first chip pads adjacent to the first surface,
   each of the plurality of second semiconductor chips includes a plurality of second chip pads,
   the plurality of second chip pads are connected to corresponding ones of the plurality of first chip pads, and
   the plurality of conductive pillars are connected to corresponding ones of the plurality of first chip pads.

7. The semiconductor package of claim 6, further comprising:
   a plurality of connectors between the first semiconductor chip and each of the plurality of second semiconductor chips,
   wherein the plurality of second chip pads are connected through the connectors to the corresponding first chip pads.

8. The semiconductor package of claim 6, wherein the plurality of second chip pads are in direct contact with the corresponding first chip pads.

9. The semiconductor package of claim 4, further comprising:
   a plurality of bumps between the substrate and the plurality of conductive pillars,
   wherein each of the plurality of conductive pillars is connected to the substrate through a corresponding one of the bumps.

10. The semiconductor package of claim 4, further comprising:
    a plurality of bumps on a bottom surface of the substrate, wherein
    the substrate includes a plurality of redistribution patterns, and
    each of the plurality of conductive pillars is connected to a corresponding one of the redistribution patterns.

11. The semiconductor package of claim 10, wherein each of the first semiconductor chip and the substrate has a width along a first direction parallel to the first surface,
    wherein the width of the substrate is greater than the width of the first semiconductor chip.

12. A semiconductor package, comprising:
    a first semiconductor chip;
    a plurality of second semiconductor chips on a first surface of the first semiconductor chip and horizontally spaced apart from each other; and
    a plurality of conductive pillars on the first surface of the first semiconductor chip and between the plurality of second semiconductor chips; and
    a substrate,
    wherein the plurality of second semiconductor chips and the plurality of conductive pillars are connected to the first surface of the first semiconductor chip wherein one of the plurality of second semiconductor chips is spaced apart from the substrate and electrically connected to the substrate through at least one of the plurality of conductive pillars, and having no conductive pads between the one of the plurality of second semiconductor chip and the substrate.

13. The semiconductor package of claim 12, wherein the first semiconductor chip includes a first circuit layer adjacent to the first surface.

14. The semiconductor package of claim 12, wherein
    the first semiconductor chip has a width along a first direction parallel to the first surface, and
    each of the plurality of second semiconductor chips has a width along the first direction,
    wherein the width of the first semiconductor chip is greater than a sum of the widths of the plurality of second semiconductor chips.

15. The semiconductor package of claim 14, wherein each of the plurality of second semiconductor chips has a height along a second direction perpendicular to the first surface, and each of the plurality of conductive pillars has a height along the second direction, wherein the height of each of the plurality of conductive pillars is the same as or greater than the height of each of the plurality of second semiconductor chips.

16. The semiconductor package of claim 12, wherein the plurality of second semiconductor chips and the plurality of conductive pillars are between the first semiconductor chip and the substrate.

17. The semiconductor package of claim 16, wherein the plurality of conductive pillars are connected to the substrate.

18. The semiconductor package of claim 17, further comprising:

a through electrode that penetrates another of the plurality of second semiconductor chips, wherein the through electrode is connected to the substrate.

\* \* \* \* \*